US008809987B2

(12) United States Patent
Chen et al.

(10) Patent No.: US 8,809,987 B2
(45) Date of Patent: Aug. 19, 2014

(54) NORMALLY-OFF III-NITRIDE METAL-2DEG TUNNEL JUNCTION FIELD-EFFECT TRANSISTORS

(75) Inventors: Jing Chen, Kowloon (HK); Li Yuan, Kowloon (HK); Hongwei Chen, Kowloon (HK); Chunhua Zhou, Kowloon (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 13/699,296

(22) PCT Filed: Sep. 8, 2010

(86) PCT No.: PCT/CN2010/001373
§ 371 (c)(1),
(2), (4) Date: Nov. 20, 2012

(87) PCT Pub. No.: WO2012/003609
PCT Pub. Date: Jan. 12, 2012

(65) Prior Publication Data
US 2013/0092958 A1    Apr. 18, 2013

Related U.S. Application Data

(60) Provisional application No. 61/344,356, filed on Jul. 6, 2010.

(51) Int. Cl.
*H01L 29/47* (2006.01)
*H01L 21/28* (2006.01)
*H01L 29/20* (2006.01)
*H01L 29/872* (2006.01)

(52) U.S. Cl.
CPC .............................. *H01L 29/2003* (2013.01);
*H01L 29/872* (2013.01)
USPC ........................................ 257/472; 438/572

(58) Field of Classification Search
CPC .................. H01L 21/28581; H01L 29/2003;
H01L 29/7787; H01L 29/7781; H01L 29/402;
H01L 29/778; H01L 29/872; H01L 29/88;
H01L 29/1608; H01L 29/7788; H01L 29/7786
USPC .............. 257/76, 77, 194, 472; 438/172, 534, 438/572
See application file for complete search history.

(56) References Cited

U.S. PATENT DOCUMENTS 6,593,603 B1    7/2003    Kim et al.
6,784,035 B2    8/2004    Snyder et al.
(Continued)

FOREIGN PATENT DOCUMENTS

CN    1354528 A    6/2002
CN    1428870 A    7/2003
(Continued)

OTHER PUBLICATIONS

International Search Report for PCT Patent Application No. CN2010/001373 dated Apr. 14, 2011, 4 pages.
(Continued)

*Primary Examiner* — Nikolay Yushin
(74) *Attorney, Agent, or Firm* — Amin, Turocy & Watson, LLP

(57) ABSTRACT

Structures, devices and methods are provided for creating heterojunction AlGaN/GaN metal two-dimensional electron gas (2DEG) tunnel-junction field-effect transistors (TJ-FET). In one aspect, metal-2DEG Schottky tunnel junctions can be employed in group III-Nitride field-effect devices that enable normally-off operation, large breakdown voltage, low leakage current, and high on/off current ratio. As a further advantage, AlGaN/GaN metal-2DEG TJ-FETs are disclosed that can be fabricated in a lateral configuration and/or a vertical configuration. Further non-limiting embodiments are provided that illustrate the advantages and flexibility of the disclosed structures.

20 Claims, 35 Drawing Sheets

Passivation Layer
Gate Metallization Layer
Gate Insulating Dielectric Layer
Source Contact
Ohmic Drain Contact
Nitride Semiconductor Barrier Layer
Second Nitride Semiconductor Layer
First Nitride Semiconductor Layer
III-Nitride Material Layer
Substrate

(56) References Cited

U.S. PATENT DOCUMENTS

| | | | |
|---|---|---|---|
| 6,974,737 | B2 | 12/2005 | Snyder et al. |
| 7,230,284 | B2 | 6/2007 | Parikh et al. |
| 7,649,215 | B2 * | 1/2010 | Beach ..................... 257/194 |
| 8,304,811 | B2 | 11/2012 | Zhang |
| 8,390,000 | B2 * | 3/2013 | Chu et al. ..................... 257/76 |
| 2005/0051796 | A1 * | 3/2005 | Parikh et al. .............. 257/192 |
| 2007/0158692 | A1 * | 7/2007 | Nakayama et al. .......... 257/213 |
| 2009/0146185 | A1 | 6/2009 | Suh et al. |
| 2009/0179281 | A1 | 7/2009 | Zhu et al. |
| 2010/0013015 | A1 | 1/2010 | Snyder |

FOREIGN PATENT DOCUMENTS

| | | |
|---|---|---|
| CN | 1557024 A | 12/2004 |
| CN | 1937206 A | 3/2007 |
| CN | 101320750 A | 12/2008 |
| CN | 101604704 A | 12/2009 |
| WO | WO 2012003609 A1 | 1/2012 |

OTHER PUBLICATIONS

International Written Opinion for PCT Patent Application No. CN2010/001373 dated Apr. 14, 2011, 5 pages.

Ota et al., "A Normally-off GaN FET with High Threshold Voltage Uniformity Using a Novel Piezo Neutralization Technique", IEDM Technical Digest, p. 153-156, Dec. 2009.

Derluyn et al., "Low Leakage High Breakdown E-Mode GaN DHFET on Si by Selective Removal of In-Situ Grown Si3N4", IEDM Technical Digest, p. 157-160, Dec. 2009.

Ohmaki et al., "Enhancement-Mode AlGaN/AlN/GaN High Electron Mobility Transistor with Low On-State Resistance and High Breakdown Voltage", Jpn. J. Appl. Phys., vol. 45, No. 44, p. 1168-1170, Oct. 2006.

3Kedzierski et al., "Complementary silicide source/drain thin-body MOSFETs for the 20nm gate length regime", IEDM Technical Digest, p. 57-60, Dec. 2000.

Nishisaka, et al., "Schottky Source/Drain SOI MOSFET with Shallow Doped Extension", Jpn. J. Appl. Phys., vol. 42, No. 4B, p. 2009-2013, Apr. 2003.

Mookerjea et al., "Experimental Demonstration of 100nm Channel Length In0.53Ga0.47As-based Vertical Inter-band Tunnel Field Effect Transistors (TFETs) for Ultra Low-Power Logic and SRAM Applications", IEDM Technical Digest, p. 949-951, Dec. 2009.

Bahat-Treidel et al., "AlGaN/GaN HEMT With Integrated Recessed Schottky-Drain Protection Diode", IEEE Electron Device Lett., vol. 30, No. 9, p. 901-903, Sep. 2009.

DESSIS ISE TCAD Manual Release 10.0, Integrated Systems Engineering AG, Switzerland, 2004.

* cited by examiner

| | Ohmic Contact Layer |
| | III-Nitride Semiconductor Barrier Layer |
| | III-Nitride Semiconductor Buffer Layer |
| | Substrate |

Passivation Layer
Gate Metallization Layer
Gate Insulating Dielectric Layer
Metal Layer
III-Nitride Semiconductor Barrier Layer
III-Nitride Semiconductor Buffer Layer
Substrate

| | Passivation Layer |
| | Gate Metallization Layer |
| | Gate Insulating Dielectric Layer |
| | Source Contact |
| | Ohmic Drain Contact |
| | Nitride Semiconductor Barrier Layer |
| | Second Nitride Semiconductor Layer |
| | First Nitride Semiconductor Layer |
| | III-nitride Material Substrate Layer |

| | Passivation Layer |
| | Gate Metallization Layer |
| | Gate Insulating Dielectric Layer |
| | Source Contact |
| | Ohmic Drain Contact |
| | Nitride Semiconductor Barrier Layer |
| | Second Nitride Semiconductor Layer |
| | First Nitride Semiconductor Layer |
| | III-Nitride Material Layer |
| | Substrate |

| | Ohmic Drain Contact |
| --- | --- |
| | Nitride Semiconductor Barrier Layer |
| | Second Nitride Semiconductor Layer |
| | First Nitride Semiconductor Layer |
| | III-Nitride Material Layer |
| | Substrate |

| | |
|---|---|
| ▨ | Photo Resist Layer |
| ▦ | Ohmic Drain Contact |
| ▢ | Nitride Semiconductor Barrier Layer |
| ▥ | Second Nitride Semiconductor Layer |
| ▨ | First Nitride Semiconductor Layer |
| ▦ | III-Nitride Material Layer |
| ▨ | Substrate |

| | Passivation Layer |
|---|---|
| | Gate Metallization Layer |
| | Gate Insulating Dielectric Layer |
| | Source Contact |
| | Ohmic Drain Contact |
| | Nitride Semiconductor Barrier Layer |
| | Second Nitride Semiconductor Layer |
| | First Nitride Semiconductor Layer |
| | III-Nitride Material Layer |
| | Substrate |

NORMALLY-OFF III-NITRIDE METAL-2DEG TUNNEL JUNCTION FIELD-EFFECT TRANSISTORS

CROSS-REFERENCE TO RELATED APPLICATIONS

This application is a U.S. National Stage of PCT Patent Application No. PCT/CN2010/001373, filed Sep. 8, 2010 and entitled "NORMALLY-OFF III-NITRIDE METAL-2DEG TUNNEL JUNCTION FIELD-EFFECT TRANSISTORS"; which claims priority to U.S. Provisional Patent Application Ser. No. 61/344,356, filed on Jul. 6, 2010 and entitled "NORMALLY-OFF III-NITRIDE SCHOTTKY-SOURCE TUNNEL HETEROSTRUCTURE FIELD-EFFECT TRANSISTORS AND THE METHOD OF MAKING THE SAME". The entireties of the above-referenced applications are incorporated herein by reference.

FIELD OF THE INVENTION

The subject disclosure is directed to field effect transistors and, more specifically, to structures, devices, and methods for creating normally-off III-nitride Metal two-dimensional electron gas (2DEG) tunnel junction field-effect transistors.

BACKGROUND OF THE INVENTION

High Electron Mobility Transistors (HEMTs), also called heterostructure field-effect transistors (HFETs) or modulation-doped field-effect transistors (MODFETs), are field effect transistors typically incorporating a junction between two materials with different band gaps, e.g., a heterojunction, as the channel instead of a doped region. HEMTs use high mobility electrons generated by a heterojunction comprised of a highly-doped wider-bandgap n-type donor-supply layer, or unintentionally doped Aluminum-Gallium-Nitride (AlGaN), for example, and a non-doped narrower-bandgap layer with little or no intentional dopants, e.g., Gallium-Nitride (GaN).

For example, electrons generated in an n-type donor-supply layer can drop into the non-doped narrower-bandgap channel at the heterojunction to form a thin depleted n-type donor-supply sub-layer and narrower-bandgap channel, due to the heterojunction created by different band-gap materials forming an electron potential well in the conduction band on the non-doped side of the heterojunction. In the framework of AlGaN/GaN hetero structures, there is often no dopant required in the AlGaN layer due to the strong spontaneous and piezoelectric polarization effect in such systems. For example, electrons from surface donors can be swept into the GaN channel by the intrinsic polarization induced electric field. In this instance, the electrons can move quickly without colliding with any impurities, due to the unintentionally doped (e.g., not intentionally doped) layer's relative lack of impurities or dopants, from which the electrons cannot escape. The net result of such a heterojunction is to create a very thin layer of highly mobile conducting electrons with very high concentration or density, giving the channel very low resistivity. This layer is known as a two-dimensional electron gas (2DEG). As can be expected in field-effect transistors (FET), voltage applied to the gate alters the conductivity of this layer to form transistor structures.

One kind of high-electron mobility transistor (HEMT) including Gallium Nitride is known as an Aluminum Gallium Nitride/Gallium Nitride (AlGaN/GaN) HEMT, or an AlGaN/GaN HEMT. Typically, AlGaN/GaN HEMTs can be fabricated by growing crystalline films of GaN, AlGaN, etc. on a substrate (e.g., sapphire, silicon (Si)(111), silicon carbide (SiC), etc.) through an epitaxial crystal growth method (e.g., metal organic chemical vapor deposition (MOCVD), molecular beam epitaxy (MBE), etc.) and processing the epitaxial substrate thus grown, to form the desired structures.

Group III-nitride (III-N) compound semiconductor materials, including GaN, advantageously possess a wide band gap (or bandgap), a high breakdown electric-field, a large thermal conductivity, and excellent semiconductor behavior at temperatures exceeding 250° C. In addition, a wide-bandgap heterostructure system, e.g., incorporating an AlGaN/GaN heterostructure enhanced by spontaneous and piezoelectric polarization effects, can yield a 2DEG channel with a high sheet charge concentration and high electron mobility, both of which lead to high current driving capability.

As such, Group III-nitride semiconductor materials, especially in the form of heterostructures, are favored candidates for fabricating power semiconductor devices. For example, III-nitride heterostructures can generate record output power densities at microwave and millimeter-wave frequencies. In addition, the III-nitride heterostructure devices, especially in the form of HEMT, are capable of delivering high operating frequency and high breakdown voltage simultaneously. Thus, the III-nitride heterostructure devices are also ideal candidates for the development of high-performance digital/analog mixed-signal integrated circuits.

AlGaN/GaN HEMTs are suitable for high-power, high-frequency, and high-temperature operations, because of the material advantages and high density carriers in the 2DEG channel. The conventional Ga-face AlGaN/GaN HEMT features strong spontaneous and piezoelectric polarization effect that results in very high 2DEG density in the range of approximately $10^{13}$ charges per square centimeter ($cm^2$) even without any intentional doping, which is an order of magnitude higher than those obtained in gallium arsenide (GaAs) and indium phosphide (InP) based HEMT structures that must feature intentional doping. Although the high 2DEG density is beneficial to achieving high current density and consequently, low on-resistance, it also results in a HEMT device that requires a negative gate bias to turn off the conduction current, thus, presenting the conventional AlGaN/GaN HEMT devices as normally-on or depletion mode devices, which are defined as those with negative threshold voltage.

However, in circuit applications, normally-off or enhancement-mode HEMTs featuring positive threshold voltage are highly desirable because of simplified circuit configurations, reduced circuit complexity and simplified protection scheme. For instance, in radio-frequency (RF), microwave, and millimeter-wave circuits, normally-off devices enable the use of single-polarity (positive) supply voltage by eliminating the negative supply voltage. In GaN-based digital ICs, due to the lack of high-performance p-channel devices and low intrinsic hole mobility, CMOS-like implementation using p-channel and n-channel devices may not be a good choice. Instead, an all n-channel FET implementation strategy would be a needed for realizing high-performance (e.g., high speed, high voltage swing, etc.). The direct coupled FET logic (DCFL) featuring E-mode FET as the driver and D-mode FET as the load is the simplest configuration for n-channel FET logic circuits. In addition, in power electronics application, normally-off devices are highly desirable because of their inherent fail-safe operation as the current conduction is naturally shut off in case the gate control is lost.

Various conventional techniques for fabricating normally-off AlGaN/GaN HEMTs can include gate-recess by thinning down the gate barrier layer, fluorine plasma ion implantation by implanting fluorine ions into the gate barrier, use of thin gate barrier, and the use of p-type cap layer (e.g., GaN or AlGaN) or an InGaN cap layer. However, these structures typically require sophisticated fabrication process techniques such as, for example, low-damage dry etching, F (fluorine) plasma treatments, ion implantation, etc., which typically rely on the principle of depleting the 2DEG in the channel at zero gate bias.

Another challenge in the implementation of conventional AlGaN/GaN HEMTs is the relatively large off-state leakage current through the buffer layer, which could also result in premature breakdown in AlGaN/GaN HEMTs. For instance, in conventional HEMTs, both the source and drain are typically formed by making ohmic contact to the 2DEG channel. However, if the buffer is leaky, the off-state source-drain leakage current will be large, leading to undesirable features such as large off-state power consumption. Conventional undoped GaN buffer layers, unfortunately, usually feature non-negligible leakage due to the high background doping (e.g., by Si, (oxygen (O) impurities, etc.). Thus, sophisticated buffer techniques have been developed (e.g., AlGaN buffer, carbon (C) or iron (Fe) compensated doping in GaN) to suppress the leakage current that could otherwise result. It is thus desired to provide practical normally off HEMT devices with minimal off-state leakage current.

SUMMARY OF THE INVENTION

The following presents a simplified summary of the specification in order to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In various embodiments, metal-2DEG Schottky tunnel junctions can be employed in group III-Nitride field-effect devices that enable normally-off operation, large breakdown voltage, low leakage current, and high on/off current ratio. Accordingly, various embodiments provide structures, devices and methods for creating heterojunction AlGaN/GaN metal two-dimensional electron gas (2DEG) tunnel junction field-effect transistors (TJ-FET). As a further advantage, AlGaN/GaN metal-2DEG TJ-FETs are disclosed that can be fabricated in a lateral configuration and/or a vertical configuration.

Accordingly, in exemplary non-limiting embodiments, a tunnel junction field-effect transistor can comprise a substrate comprising a buffer layer deposited on the substrate and a barrier layer deposited on the buffer layer. In an aspect, the buffer layer and the barrier layer can form a heterojunction at an interface of the buffer layer and the barrier layer comprising a two-dimensional electron gas (2DEG) conducting channel. In addition, exemplary tunnel junction field-effect transistors can comprise a metal region adjacent to the buffer layer, spanning a portion of the heterojunction, and in Schottky contact with the 2DEG conducting channel. In other embodiments, methodologies for forming a TJ-FET according is provided according to various aspects of the disclosed subject matter that include forming a metallic Schottky source contact to the 2DEG.

These and other additional features of the disclosed subject matter are described in more detail below.

BRIEF DESCRIPTION OF THE DRAWINGS

The devices, structures, and methodologies of the disclosed subject matter are further described with reference to the accompanying drawings in which.

DETAILED DESCRIPTION OF ILLUSTRATIVE EMBODIMENTS

Overview

Figure 1:
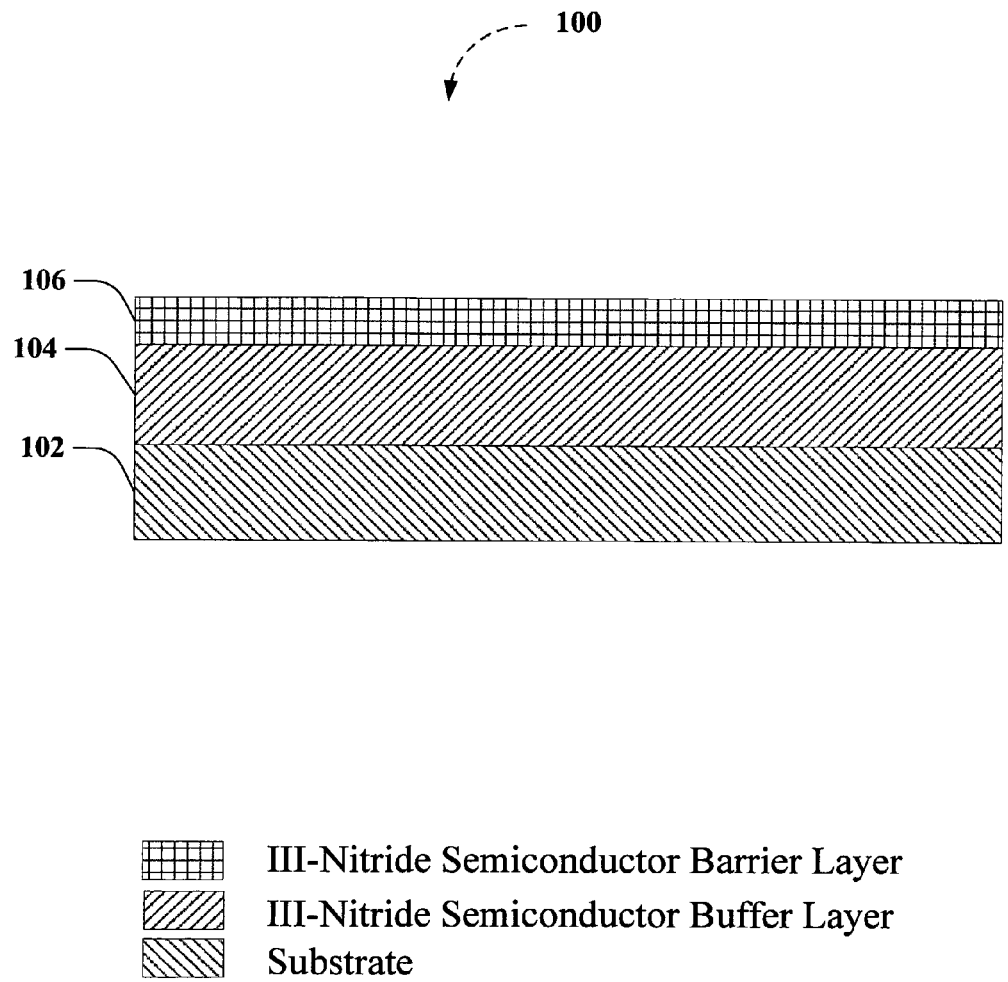
FIGS. 1-6 depict various aspects of a non-limiting Aluminum-Gallium-Nitride (AlGaN)/Gallium-Nitride (GaN) metal two-dimensional electron gas (2DEG) tunnel junction field-effect transistors (TJ-FET) at different stages of an exemplary fabrication process.

As used herein, acronyms are used to denote the following: Source (S), Drain (D), Gate (G), Current (I), Voltage (V), Breakdown Voltage (BV), Transconductance ($G_m$), L (Length, Distance, or Spacing), X (Relative Position), ohmic Contact (O), Anode (A), and Cathode (C) or Capacitance (C) as is apparent from the context.

The tunnel junction field effect transistor, typically used in Si CMOS, can also be employed in other narrow and medium bandgap semiconductor material systems such as silicon germanium (SiGe), gallium antimony (GaSb), etc. Such device structures are expected to be suitable for ultra short channel transistors due to the scalable low-resistance contacts, low off-state leakage current, and suppressed drain induced barrier lowering (DIBL) effect or the so-called short channel effect. As can be understood, factors that affect the TJ-FET's characteristics include Schottky Barrier Height (SBH), and width between the source metal and the channel semiconductor. In conventional Si TJ-FETs, low current drive capability has been observed unless SBH is made small even using low work function metal silicides featuring rare earth metal (such as erbium (Er), ytterbium (Yb), etc.). Although the low SBH can facilitate improved on-state current driving capability, such characteristics typically result in larger off-state leakage current. As a result, low tunneling barriers that facilitate devices' large on-state current can also degrade the devices' off-state performance. Consequently, even the best devices current drive level and on/off ratio obtained in Si tunnel junction FETs are approximately 10 mA/mm and $10^4$, respectively.

As described above, disclosed subject matter relates to group III-Nitride field-effect devices. Specifically, heterojunction AlGaN/GaN metal-2DEG TJ-FET devices, structures, and related fabrication methodologies are disclosed. As described herein, the TJ-FET can be realized with a standard AlGaN/GaN (high electron mobility transistor) HEMT structure, that can advantageously enable normally-off operation, large breakdown voltage, low leakage current, and high on/off current ratio. As a further advantage, AlGaN/GaN metal-2DEG TJ-FETs are disclosed that can be fabricated in a lateral configuration and/or a vertical configuration.

As an example, III-Nitride devices, namely, AlGaN/GaN metal-2DEG TJ-FETs are described and experimentally demonstrated. In aspect, a TJ-FET, when fabricated in an AlGaN/GaN HEMT structure, can enable normally-off operation, low leakage current, and high on/off current ratio, due in part to an extremely high-density 2DEG (e.g., ~$10^{13}$/cm$^2$) in Schottky contact to the source metal, forming a metal-2DEG Schottky, tunnel junction. As described herein, a Schottky junction featuring a thin Schottky barrier (e.g., a few nanometers wide) can be provided to achieve a high tunneling coefficient and tunneling current. As a result, drain current density as high as several hundred of milliAmperes/millimeter (mA/mm) can be obtained.

In an aspect, exemplary TJ-FETs can include a stable source metal such as Ti, Al, Ni, Cr, resulting in devices that are easily manufactured. According to a further aspect, exemplary non-limiting implementations can be designed and fabricated without resort to the stringent requirements of high-quality low-leakage buffer layer(s) that can be required for suppressing off-state leakage current in conventional AlGaN/GaN HEMTs or HFET. Advantageously, according to various embodiments, a Schottky metal source inherently can provide low leakage current (e.g., as low as 1 nanoAmpere/mm (nA/mm)) at large drain bias (e.g., 50 V). Thus, various embodiments can provide low off-state leakage current in high-voltage power switches. As a further advantage, various embodiments of the disclosed subject matter can provide a High $I_{ON}/I_{OFF}$ ratio (e.g., approximately $10^9$). In yet another aspect, various embodiments of the disclosed subject matter can employ threshold voltage control scheme(s) different from that of a conventional HFET, which can add another degree of freedom in realizing normally-off GaN power transistors.

In this disclosure, GaN based AlGaN/GaN metal-2DEG tunnel junction FET structures, devices, and methods are described. Thus, according to various embodiments, normally-off operation AlGaN/GaN heterostructure devices and methods for fabrication thereof are provided. For instance, a normally-off operation AlGaN/GaN heterostructure in the form of metal-2DEG tunnel junction FET can be fabricated that has 2DEG in the channel that remains high at zero gate bias rather than depleting the 2DEG at zero gate bias. According to an aspect, III-nitride heterostructures (e.g., AlGaN/GaN, AlN/GaN, InAlN/GaN) facilitate achieving high current drive capability.

As a result, these heterostructures can enable 2DEG channels with high electron density that cannot be achieved in other heterostructures (e.g., AlGaAs/GaAs, AlGaAs/InGaAs, InAlAs/InGaAs, InAlSb/InSb, etc.). Accordingly, various non-limiting implementations of the disclosed subject matter can employ a high density 2DEG channel in Schottky contact with the source metal, resulting in a thin tunnel barrier (e.g., the depletion region at the metal semiconductor junction) with high tunneling. Thus, in an aspect gate bias can control the effective tunnel barrier thickness as well as the barrier height.

In a further non-limiting aspect, the disclosed subject matter provides using metal as a drain electrode in addition to using metal as a source electrode. That is, drain electrode(s) can be formed by either ohmic contact or Schottky contact. It can be understood that while ohmic drain configuration can avoid voltage offset associated with the drain Schottky junction and maintains high current drive capability, the Schottky drain can provide a reverse drain blocking capability.

Exemplary Non-Limiting AlGaN/GaN Metal-2DEG TJ-FETs

FIGS. 1-6 depict various aspects of a non-limiting Aluminum-Gallium-Nitride (AlGaN)/Gallium-Nitride (GaN) metal two-dimensional electron gas (2DEG) tunnel junction field-effect transistors (TJ-FET) at different stages of an exemplary fabrication process. According to various embodiments, exemplary process steps can include active region isolation, drain electrode (e.g., ohmic, Schottky, etc.) formation, source recess and metallization, gate dielectric layer deposition, and gate metallization. Thus, FIG. 1 illustrates an exemplary starting wafer 100 for a non-limiting implementation of III-nitride metal-2DEG tunnel junction FET. For example, III-nitride metal-2DEG TJ-FET can typically be fabricated on a substrate 102 (e.g., sapphire, Silicon (Si), Silicon Carbide (SiC), etc.) by growing III-nitride material buffer layer 104 (e.g., GaN, AlN, AlGaN, etc.), III-nitride semiconductor barrier layer 106 (e.g., AlGaN, InAlN, AlN, etc.), etc., for example, via an epitaxial crystal growth method (e.g., metal organic chemical vapor deposition (MOCVD), molecular beam epitaxy (MBE), etc.). Further processing the heterostructure (102/104/106) thus grown, can be performed to form the desired structures (e.g., source, gate, and drain, etc.) as described below.

Figure 2:
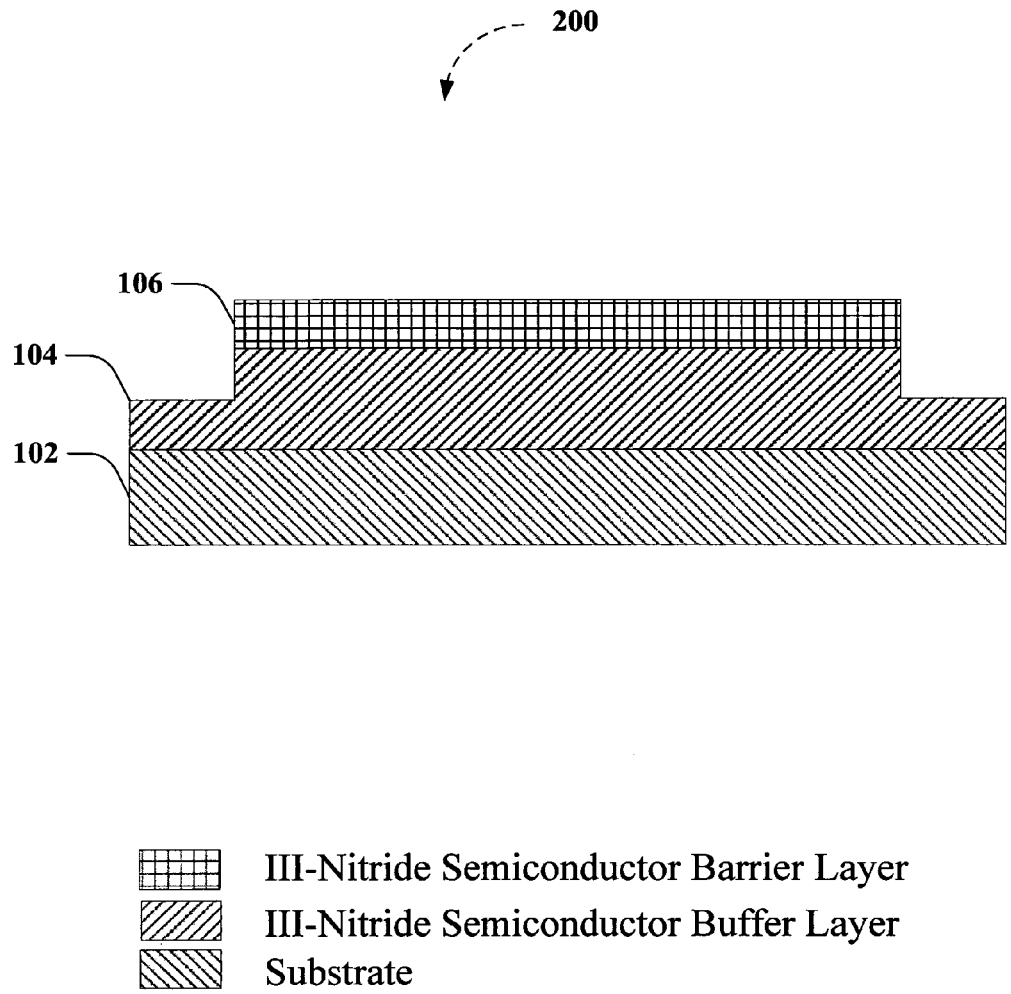

FIG. 2 illustrates an exemplary active region isolation process 200 that can be performed via mesa etching the heterostructure (102/104/106) used for AlGaN/GaN metal-2DEG TJ-FET fabrication. For instance, a dry etching technique such as inductively coupled plasma reactive ion etching (ICP-RIE) can be performed to define active regions and form isolation regions between individual devices. The isolation can also be performed by ion implanting the region outside the active device areas, for example, enabling a planar isolation.

Figure 3:
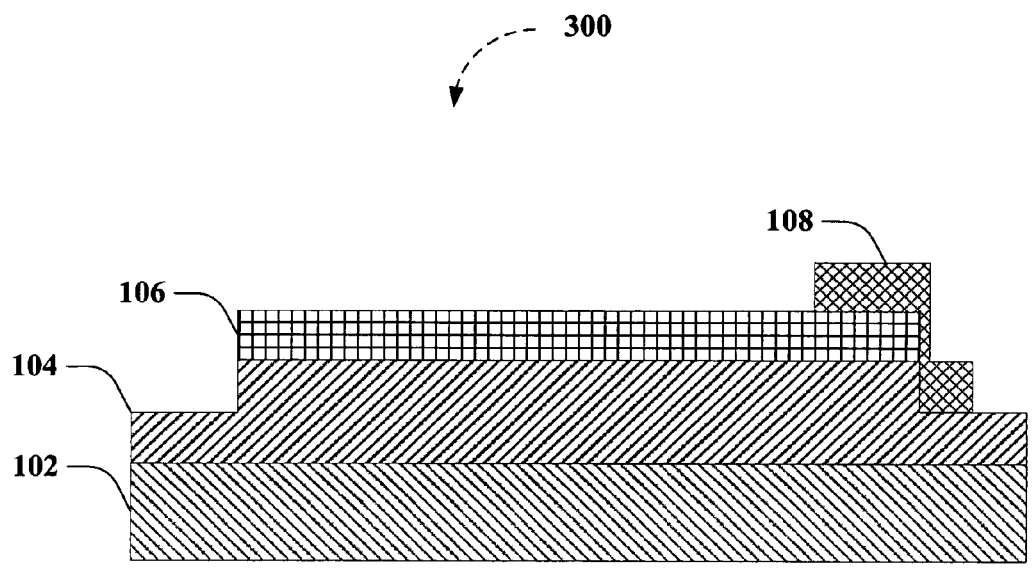

FIG. 3 further illustrates a schematic cross-section 300 of an exemplary implementation of an AlGaN/GaN metal-2DEG TJ-FET fabrication after formation of an ohmic drain contact 108. According to an aspect, an ohmic contact layer 108 can be formed on the underlying III-nitride semiconductor barrier layer 106 (and hence underlying 2DEG between layer III-nitride semiconductor barrier layer 106 and III-nitride material buffer layer 104). According to a further non-limiting aspect, the ohmic drain contact 108 can comprise a metal stack (e.g., comprising any of titanium (Ti), Al, Nickel (Ni) and gold (Au), etc., or other compositions shown to be effective in forming ohmic contact with low contact resistance). In yet another non-limiting aspect the evolving device can be thermally annealed (e.g., thermally annealed at 850 degrees Celsius for 35 seconds, etc.).

Figure 4:
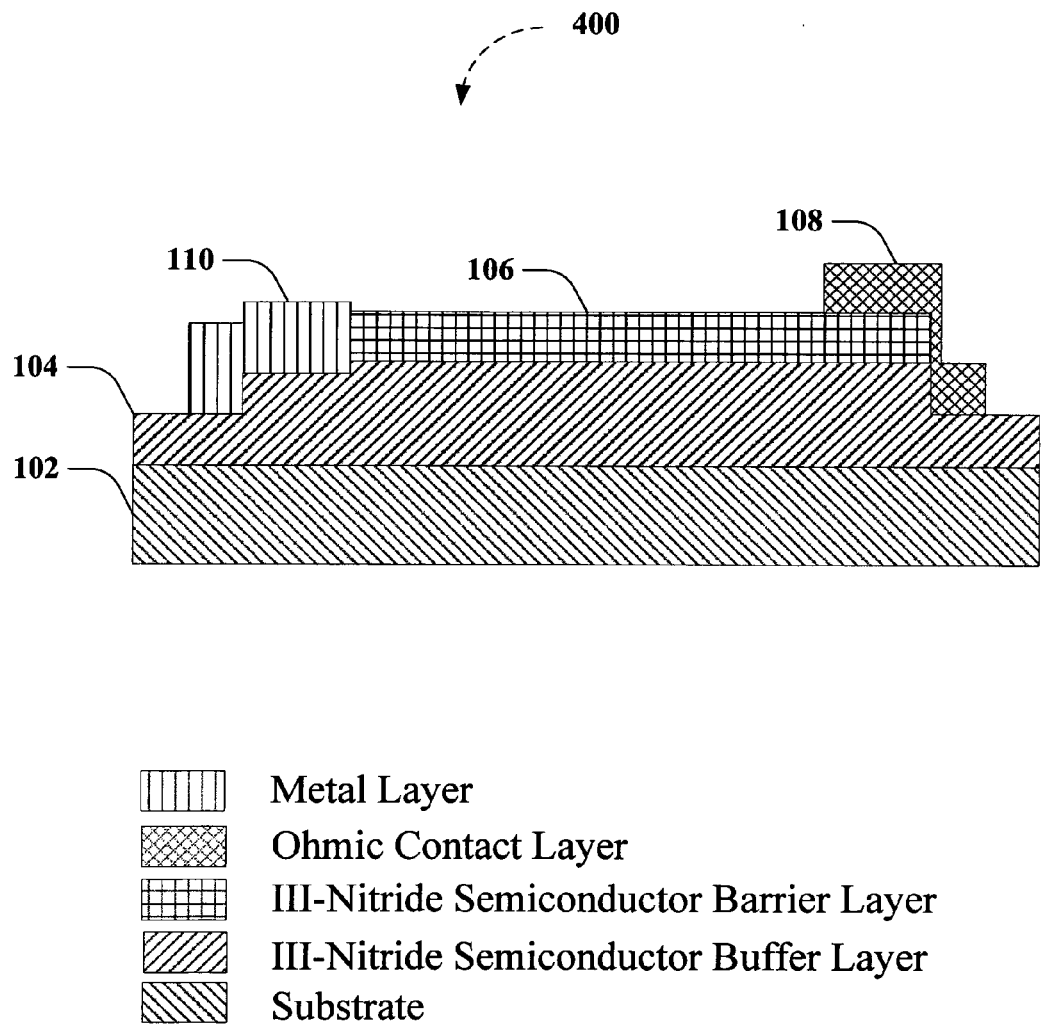

FIG. 4 further depicts a schematic cross-section 400 of an exemplary AlGaN/GaN Schottky metal-2DEG TJ-FET fabrication including formation of a recessed source and a Schottky source contact 110. For instance, in forming the recessed source and Schottky source contact, dry etching techniques such as ICP-RIE or other etching techniques that create low-damage and nearly vertical sidewall profile can be performed to etch through the III-nitride semiconductor barrier layer 106 and define the source contact region. Subsequently, a metal layer 110 (e.g., source contact 110) with single or multiple metal layers (e.g., Ti, Al, chromium (Cr), Ni, platinum (Pt), Au, etc.) can be deposited on III-nitride material buffer layer 104 to form a Schottky contact to 2DEG. It should be noted that, according to various embodiments, the tunnel junction exists at the metal-2DEG junction.

Figure 5:
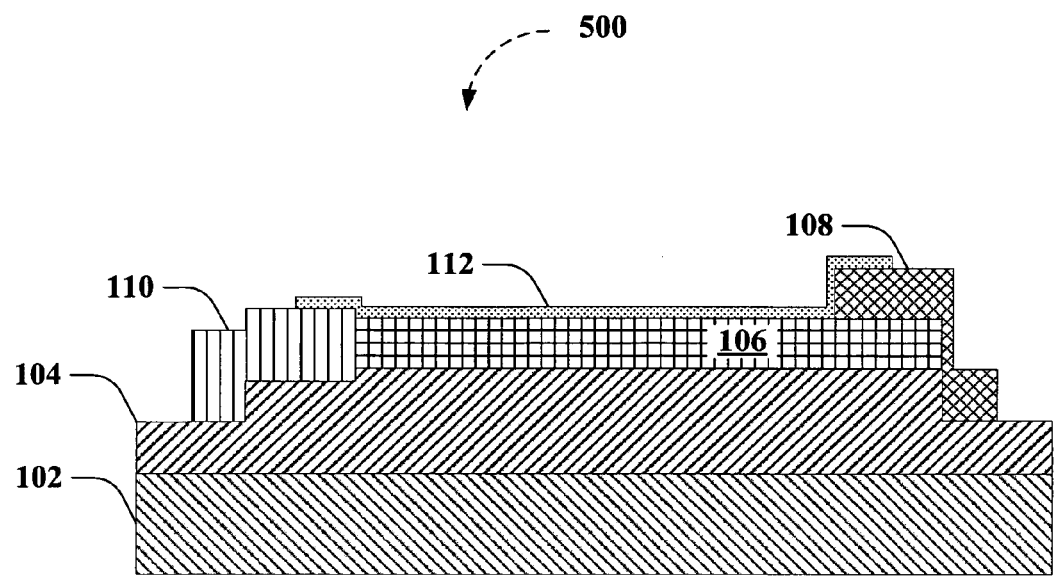

FIG. 5 further illustrates a schematic cross-section 500 of the AlGaN/GaN metal-2DEG TJ-FET after depositing gate insulating dielectric layer 112. According to various embodiments, gate insulating dielectric layer 112 or passivation layer can comprise a dielectric (e.g., aluminum oxide ($Al_2O_3$), aluminum nitride (AlN), silicon nitride (SiN), silicon dioxide ($SiO_2$), hafnium dioxide ($HfO_2$), etc.) that can be grown or deposited on semiconductor layer III-nitride semiconductor barrier layer 106. In addition, wet etching such as a buffered oxide etch (BOE) or dry etch techniques can be performed to etch through gate insulating dielectric layer 112 to expose source (e.g., Schottky source contact 110 region) and drain contact (e.g., ohmic contact layer 108 region) regions.

Figure 6:
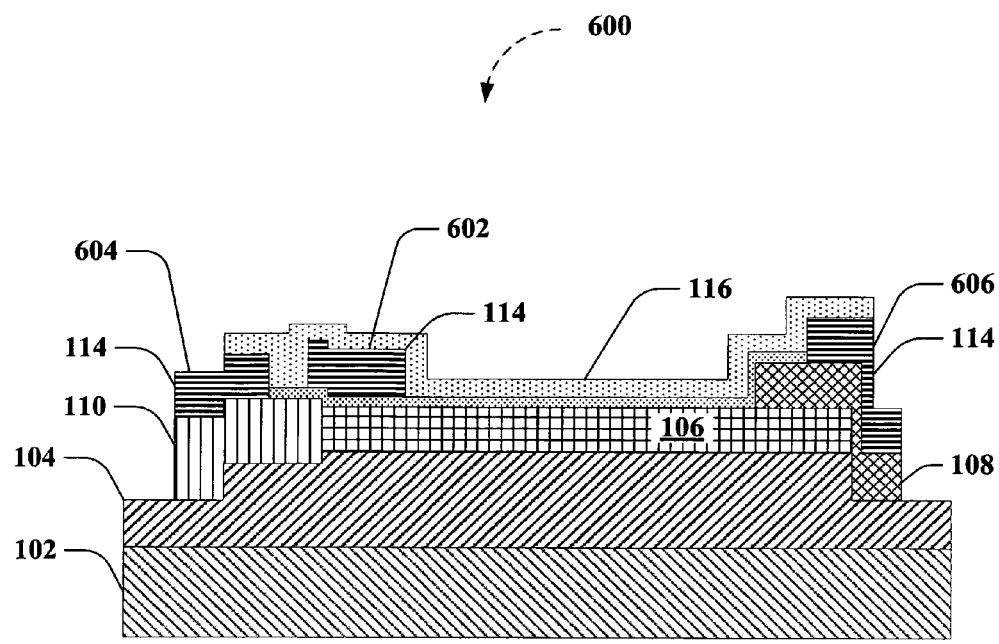

FIG. 6 depicts a schematic cross-section of an exemplary AlGaN/GaN metal-2DEG TJ-FET 600 after the formation of a gate electrode 602 and interconnects on the source contact 604 (e.g., Schottky source contact 110 region) and drain contact 606 (e.g., ohmic contact layer 108 region) regions. For instance, a gate metallization layer 114 can be formed by single or multiple metal layers (e.g., including Al, Ti, Ni, Pt, Au, titanium nitride (TiN), titanium tungsten (TiW), etc.). According to various aspects, gate metallization layer 114 can be deposited on gate insulating dielectric layer 112, and can be further deposited on source (e.g., Schottky source contact 110 region) and drain contact (e.g., ohmic contact layer 108 region) regions to form source and drain interconnects as shown in FIG. 6. In yet other exemplary implementations, AlGaN/GaN metal-2DEG TJ-FET can include passivation layer 116 which shall be formed with insulating dielectric materials such as SiN, $SiO_2$, $Al_2O_3$, polyimide, etc.

Accordingly, schematic structures of an exemplary non-limiting TJ-FET featuring a metal-2DEG tunnel junction at the source and an ohmic drain are depicted in FIGS. 1-6, according to various aspects. Thus, as described above, device fabrication can begin with active region formation by mesa etching or ion implantation. Drain ohmic contact (e.g., ohmic contact layer 108) can be formed by metal deposition (e.g., Ti, Al, Ni, Au, etc.) followed by rapid thermal annealing (e.g., thermal anneal at 850 degrees Celsius for 35 seconds). The source contact (e.g., Schottky source contact 110) can then be formed by creating a shallow recess followed by source metal deposition. According to an aspect, the shallow recess should encroach on III-nitride material buffer layer 104 and III-nitride semiconductor barrier layer 106 sufficiently such that the 2DEG at the sidewall of the recess regions can be exposed and direct metal-2DEG contact can be enabled and obtained in Schottky source contact 110 region.

According to an aspect, source contact metals (e.g., for Schottky source contact 110) are preferred that have relatively low work function (e.g., Ti, Al, etc.) and good adherence (e.g., Ti, Cr, Ni, Pt, etc.). According to an exemplary embodiment, a Ti-based metal composition (e.g. TiAu, or TiAlTiAu) can be used. In a further non-limiting aspect, a thin layer of gate insulating dielectric layer 112 (e.g., a few nanometers to a few tens of nanometer thick) of dielectric layer ($Al_2O_3$, SiN, $SiO_2$, $HfO_2$, or stack of these dielectric materials) can be deposited (e.g., by atomic layer deposition or other means such as plasma enhanced chemical vapor deposition (PE-CVD), sputtering, etc.). Thus, in further non-limiting aspects a gate electrode 602 (e.g., Ni, Ti, Pt, and similar based metals, etc) can be formed on top of the gate insulating dielectric layer 112. Note that in particular non-limiting embodiments there could be a small overlap between the gate 602 and source electrode 604 (not shown). In yet further non-limiting embodiments, the gate 602 and source electrodes 604 could also be self-aligned.

Thus, as can be seen in FIGS. 1-6, a conventional ohmic source contact can be replaced by Schottky metal source (Schottky source contact 110) in intimate contact with the 2DEG from the sidewall of recess in III-nitride material buffer layer 104 and III-nitride semiconductor barrier layer 106. As a result, according to various aspects, a normally-off III-nitride AlGaN/GaN metal-2DEG TJ-FET can be created. Thus, according to various embodiments, the Schottky source contact 110 to 2DEG junction is naturally reverse biased under forward drain voltage, which can effectively block buffer leakage even for a selection of a leaky buffer layer (e.g., III-nitride material buffer layer 104 selection is leaky). Accordingly, the disclosed TJ-FET structures and devices can provide a natural blocking capability to the buffer leakage problem.

In addition, it can be understood that under positive drain bias and zero gate bias, although the channel features high 2DEG density is capable of conducting current, the metal-2DEG junction is reverse biased. Advantageously, the reverse biased metal-2DEG junction features a tunnel junction with a barrier height (BH) and barrier width (BW) that, as long as the BH is high enough and BW is large enough, the tunneling current through the reverse-biased metal-2DEG junction is negligible and the transistor is in an "OFF" state. It can be further understood that as the gate bias is increased to positive value, the 2DEG density is further increased, which can lower the barrier height as a result of the mirror charge phenomenon and can reduce the barrier width as the conduction band in the 2DEG channel is pulled down. Both of these effects, when strong enough, can lead to the "turn-on" of the tunnel junction, and consequently, the current flow. Accordingly, a normally-off III-nitride field-effect transistor is provided in the form of metal-2DEG tunnel junction FET as described.

As described above, with the high density 2DEG channel that is in Schottky contact with the source metal (e.g., Schottky source contact 110), a thin tunnel barrier (the depletion region at the metal semiconductor junction) with high tunneling coefficient can be obtained. Thus, the gate bias can control the effective tunnel barrier thickness as well as the barrier height. For example, the operation principle can be further illustrated by a device simulation using 2-D simulator, as shown in FIG. 7-10.

Figure 7:
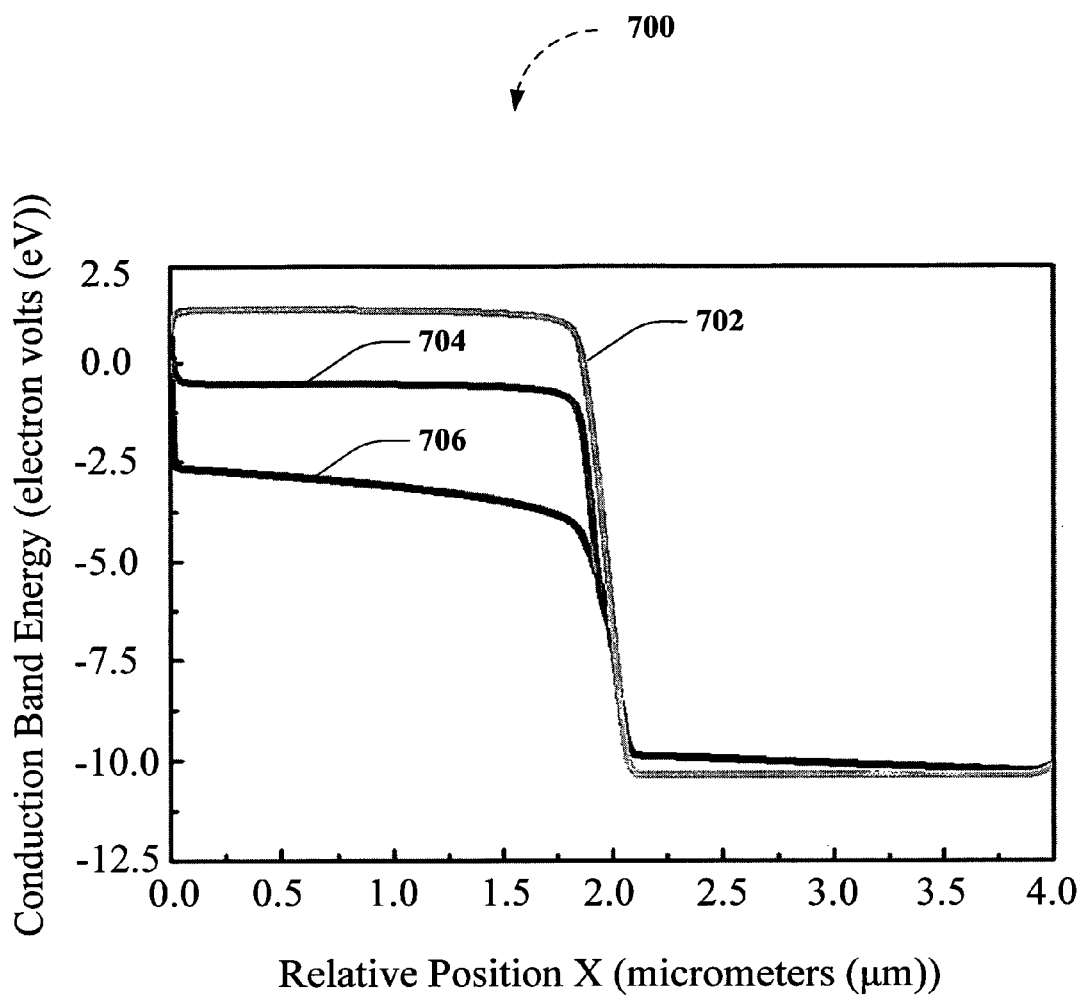
FIG. 7 depicts exemplary non-limiting conduction band energy distribution profiles as a function of relative position (X) according to various aspects of the disclosed subject matter as demonstrated by a device simulation for an exemplary TJ-FET using a 2-D simulator.
Figure 8:
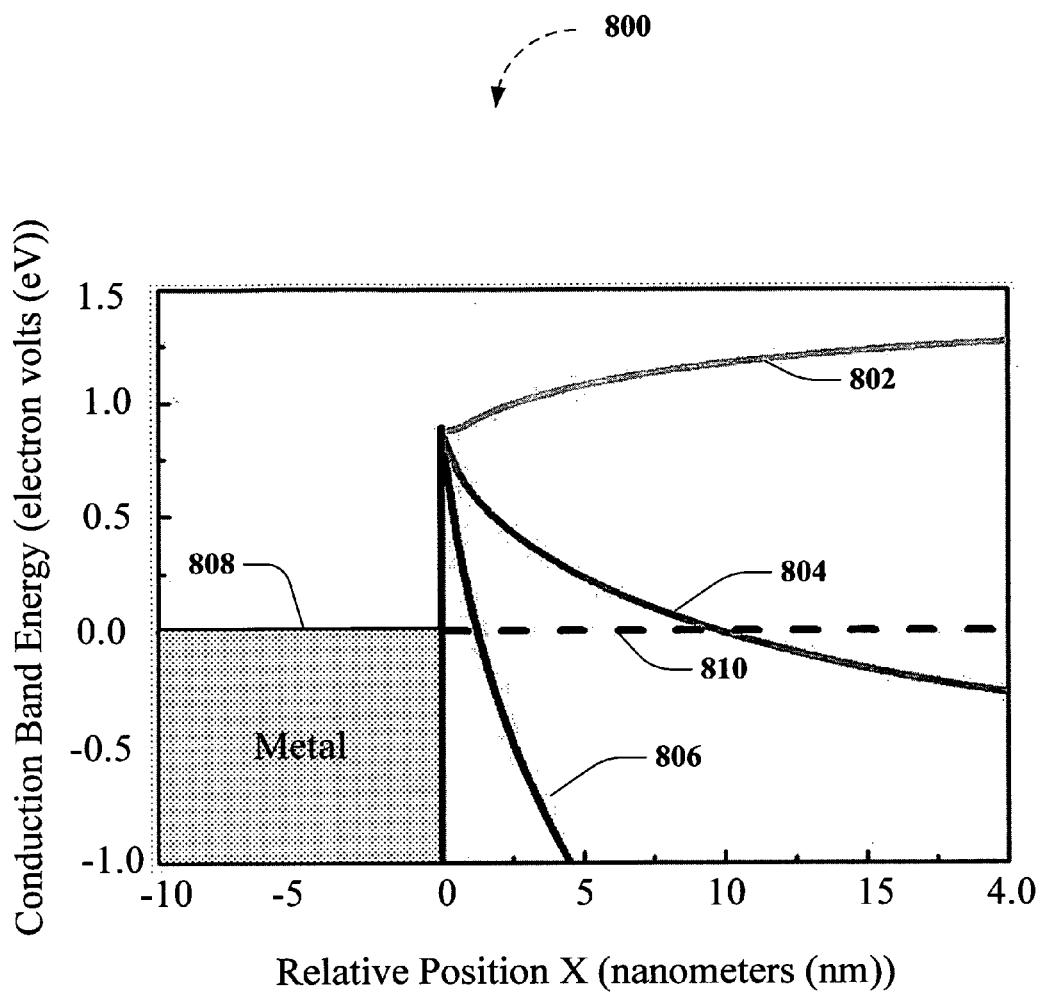
FIG. 8 further illustrates exemplary non-limiting conduction band energy distribution profiles as a function of relative position (X) according to various aspects of the disclosed subject matter and as demonstrated by a device simulation for an exemplary TJ-FET using a 2-D simulator.

For instance, FIG. 7 depicts exemplary non-limiting conduction band energy distribution profiles 700 as a function of relative position (X) according to various aspects of the disclosed subject matter as demonstrated by a device simulation for an exemplary TJ-FET using a 2-D simulator. FIG. 8 further illustrates exemplary non-limiting conduction band energy distribution profiles 800 as a function of relative position (X) according to various aspects of the disclosed subject matter and as demonstrated by a device simulation for an exemplary TJ-FET using a 2-D simulator. As can be seen in FIGS. 7-8, conduction band distribution profiles of TJ-FET are shown with the position of source-2DEG contact (e.g., Schottky source contact 110) set to be at position X=0. Note that in FIGS. 7-8, the reference characters 702/802, 704/804, 706/806 correspond to different bias conditions: 702/802 ($V_{GS}$=–3 V, $V_{DS}$=10V), 704/804 ($V_{GS}$=0 V, $V_{DS}$=10V), and 706/806 ($V_{GS}$=3 V, $V_{DS}$=10V), respectively.

Thus, FIGS. 7-8 illustrate the conduction band profile in the 2DEG channel at different $V_{DS}$ and $V_{GS}$ bias by simulation. Curves 702/802 illustrate the conduction band profile at $V_{GS}$=–3V and $V_{DS}$=10 V. It can be seen from FIGS. 7-8 that the 2DEG channel is pinched-off in this situation. Curves 704/804 (e.g. zero gate bias) illustrate the conduction band profile at $V_{GS}$=0 V and $V_{DS}$=10 V. In this situation, the 2DEG channel is not cut-off, but the effective tunnel barrier thickness can be seen to be larger than 10 nm, which suggests that the tunnel junction is turned off. Therefore the metal-2DEG TJ-FET's operation mode can be in enhancement mode in situation described by curves 704/804. Curves 706/806 illustrate the conduction band profile at $V_{GS}$=3V and $V_{DS}$=10 V. Note that the effective source tunnel barrier thickness is smaller than 1 nm in this instance, and the transistor is turned on.

Thus, according to various embodiments, both low off-state leakage and high on-state current can be obtained. For example, at zero gate bias (704/804), the effective tunnel junction barrier thickness is 10 nm, which is large enough to block the electron tunneling from the source metal 808 (e.g., Schottky source contact 110) at Fermi energy level ($E_f$) 810 to the 2DEG channel. At zero gate bias (704/804), as long as the 2DEG density is not extremely high, the effective tunnel barrier thickness will be large (e.g., >5 nm) and the tunneling coefficient is small, leading to negligible tunnel current. Thus, in this state, the exemplary devices can be said to be in the "OFF" state. However, at a gate bias of 3V (706/806), the effective bather thickness is less than 1 nm, facilitating a large tunneling coefficient and a large tunneling current. Accordingly, at high gate bias, the effective barrier thickness is reduced as a result of the higher 2DEG density and tunneling coefficient leading to high tunnel current. Consequently, in this state, the exemplary devices can be said to be in the "ON" state.

In addition, in exemplary non-limiting TJ-FETs as described herein, the Schottky barrier height at the source metal-2DEG junction is not fixed, and thus, the Schottky barrier lowering effect should be considered. For instance, there exists a mirror-image force between electrons in the 2DEG channel and the positive image charge in the source metal (e.g., Schottky source contact 110). With this mirror-image attraction force the conduction band energy near the Schottky contact (e.g., Schottky source contact 110) could be lowered and therefore the Schottky bather height is also lower, as shown in FIG. 9.

Figure 9:
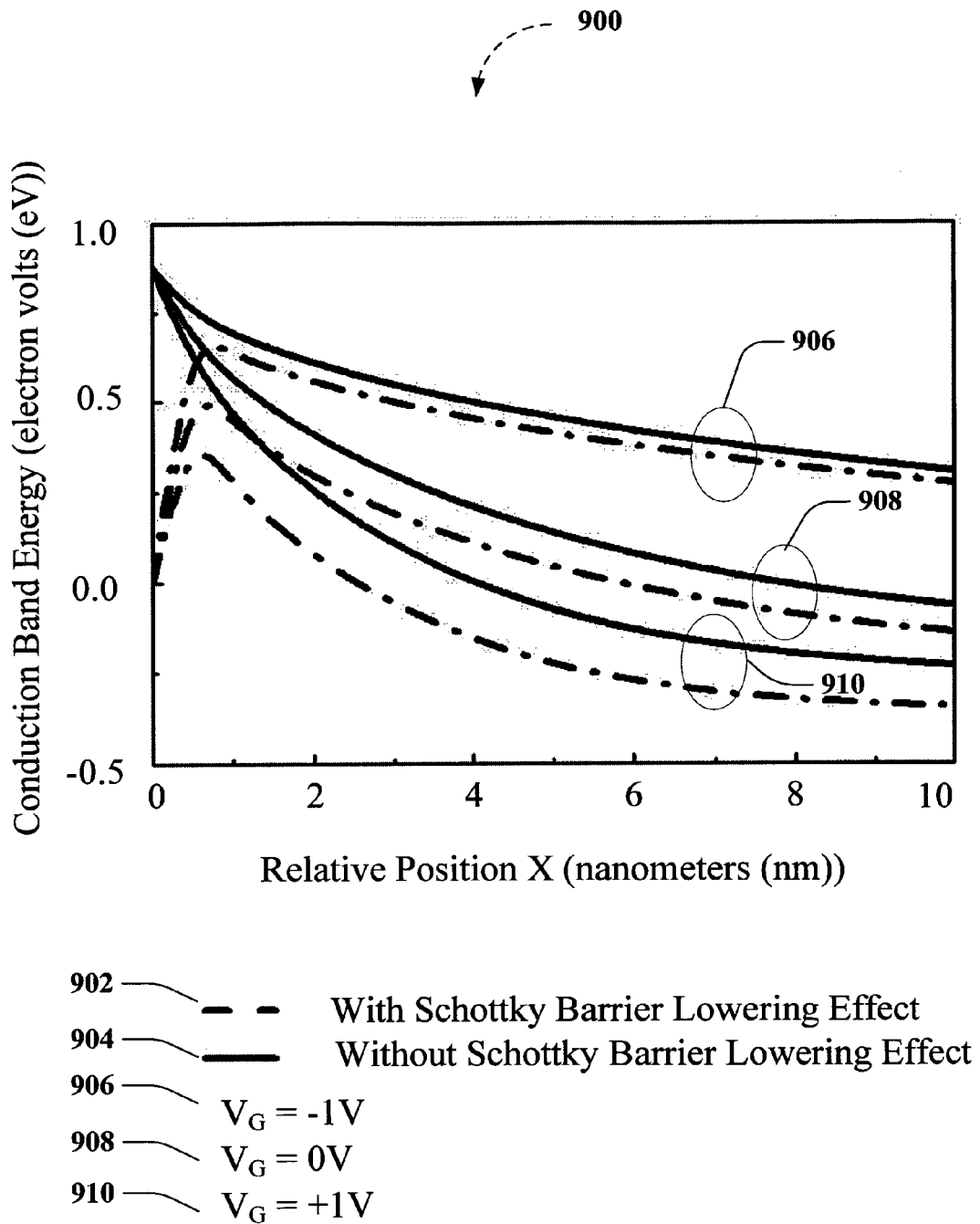
FIG. 9 further depicts aspects of exemplary non-limiting conduction band energy distribution profiles as a function of relative position (X) as demonstrated by a device simulation for an exemplary TJ-FET using a 2-D simulator.

FIG. 9 further depicts aspects of exemplary non-limiting conduction band energy distribution profiles as a function of relative position (X) as demonstrated by a device simulation for an exemplary TJ-FET using a 2-D simulator. In FIG. 9 the conduction band distribution profiles of TJ-FET with 902 (dashed lines) and without 904 (solid lines) the Schottky barrier lowering effect at different gate bias (906, 908, 910) and $V_{DS}$=0 V are shown, where X=0 corresponds to the position of source-2DEG contact. It can be seen that with larger gate voltage, the mirror-image force at the Schottky contact (e.g., Schottky source contact 110) generated by electrons in the 2DEG channel becomes larger and therefore the Schottky barrier height is lower.

Figure 10:
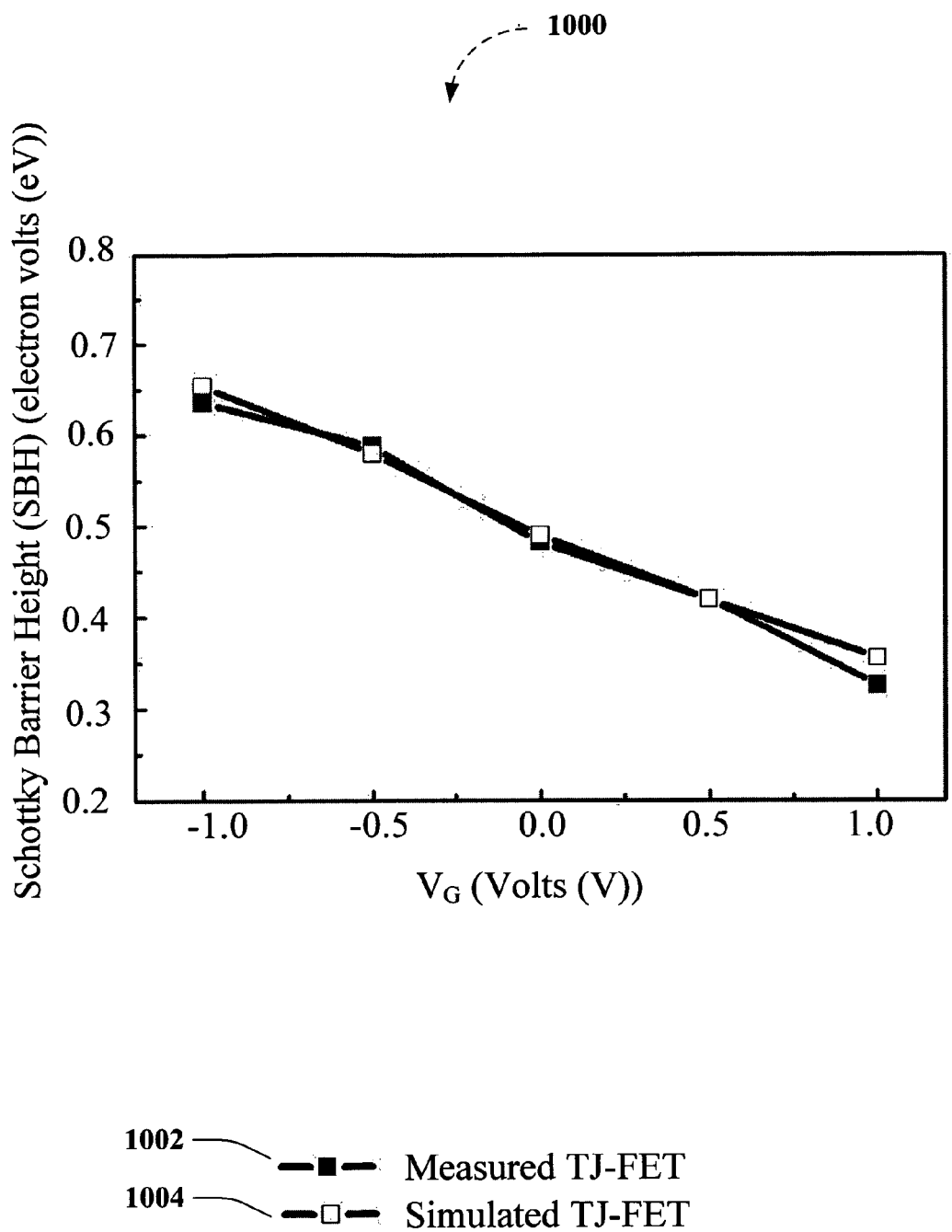
FIG. 10 illustrates simulated and measured Schottky Barrier Height (SBH) at different gate bias for an exemplary AlGaN/GaN metal-2DEG TJ-FET fabricated according to aspects of the disclosed subject matter and as demonstrated by a device simulation for an exemplary TJ-FET using a 2-D simulator.

It can be further understood that as the gate bias can affect electrons' density in the 2DEG channel, it can also affect the 2DEG-density-dependent Schottky barrier height. For instance, FIG. 10 illustrates measured 1002 and simulated 1004 Schottky Barrier Height (SBH) at different gate bias for an exemplary AlGaN/GaN metal-2DEG TJ-FET (e.g., a TJ-FET fabricated on a baseline AlGaN/GaN HEMT structure) fabricated according to aspects of the disclosed subject matter as demonstrated by a device simulation for an exemplary TJ-FET using a 2-D simulator. Measured Schottky barrier heights can be extracted from temperature dependent positive biased Schottky source current-voltage (I-V) measurement results at different gate voltages. It can be seen that the Schottky barrier lowering effect shown in FIG. 9 does match the real device characteristics.

For example, at positive gate bias, the number of electrons is expected to be large and the mirror-image force stronger, resulting in a lower Schottky barrier height and larger tunneling coefficient. In contrast, at negative gate bias, electrons in the 2DEG channel are reduced or depleted, thus the mirror-charge effect is weaker and the Schottky barrier height is large enough to keep the device in "OFF" state.

Thus, it can be understood that the gate controlling mechanism in TJ-FET structure (e.g., an exemplary TJ-FET fabricated on a baseline AlGaN/GaN HEMT such as described with reference to FIGS. 1-6) is completely different from that of HEMTs. For example, in a conventional HEMT, gate bias depletes and induces 2DEG in the channel, creating the OFF/ ON states. As described above, the strong polarization in III-nitride heterostructures (e.g., AlGaN/GaN) presents great challenge in realizing normally-off HEMT. However, in TJ-FETs, the threshold voltage is controlled by the tunnel barrier width via gate bias. Even with high 2DEG density, the threshold voltage of TJ-FET could still be positive since the turn-on of the tunnel junction requires 2DEG density as high as $9 \times 10^{12}/cm^2$.

According to particular non-limiting embodiments, the disclosed subject provides a normally off metal-2DEG TJ-FET using a commercially available AlGaN/GaN HEMT epitaxial wafer grown by MOCVD (e.g., on a 4-inch (111) silicon substrate). For instance, according to an aspect, an epi-structure can comprise one or more of a GaN buffer layer, a 2 nm AlN interface enhancement layer, an undoped 17.5 nm $Al_{0.26}Ga_{0.74}N$ barrier layer, and a 2 nm undoped GaN cap layer. Accordingly, it is noted a typical starting wafer can yield a 2DEG density of $9 \times 10^{12}/cm2$ with mobility of approximately 1600 $cm^2/V$ s, and a threshold voltage of –2.1 V.

Figure 12:
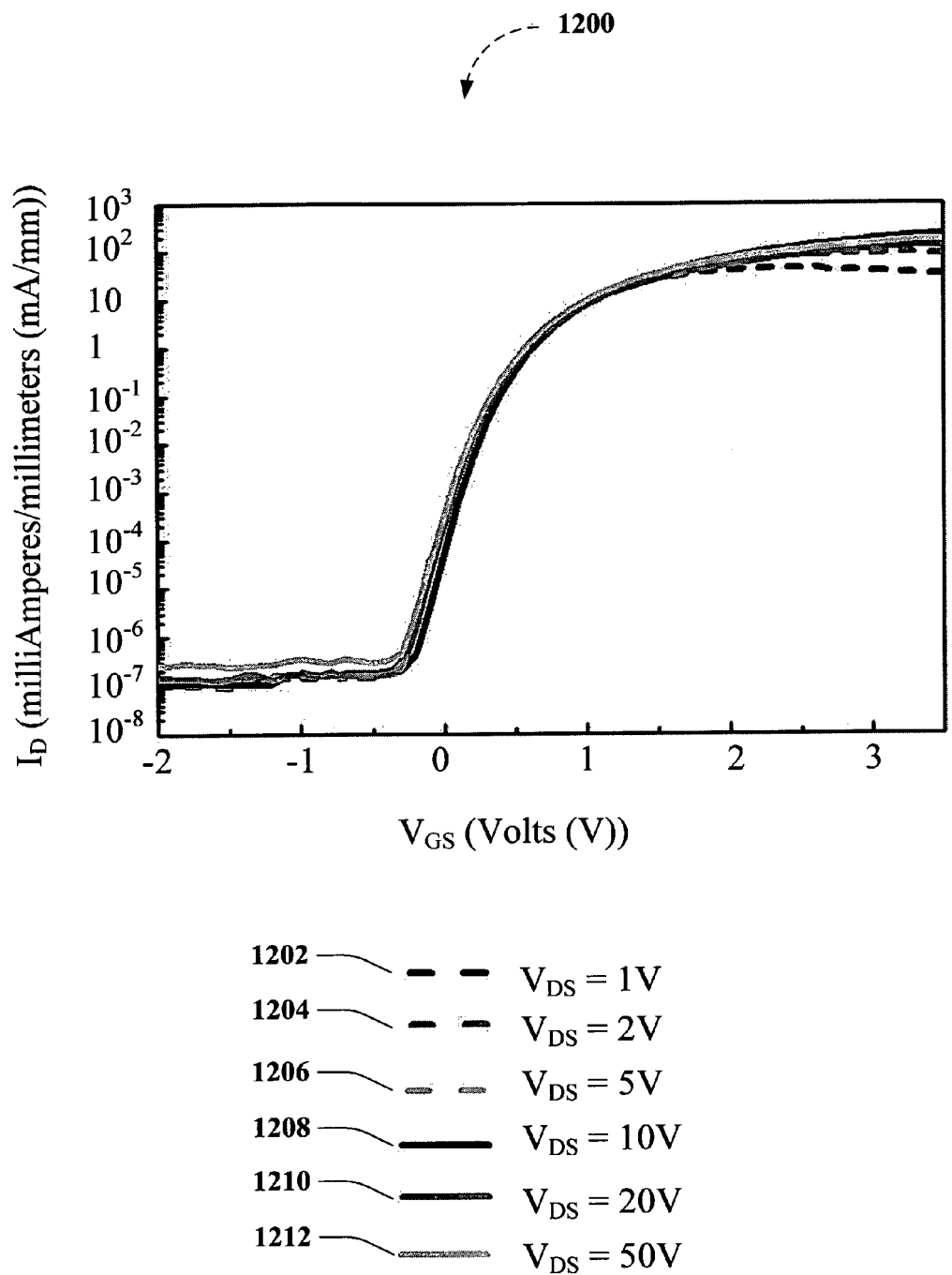
Figure 13:
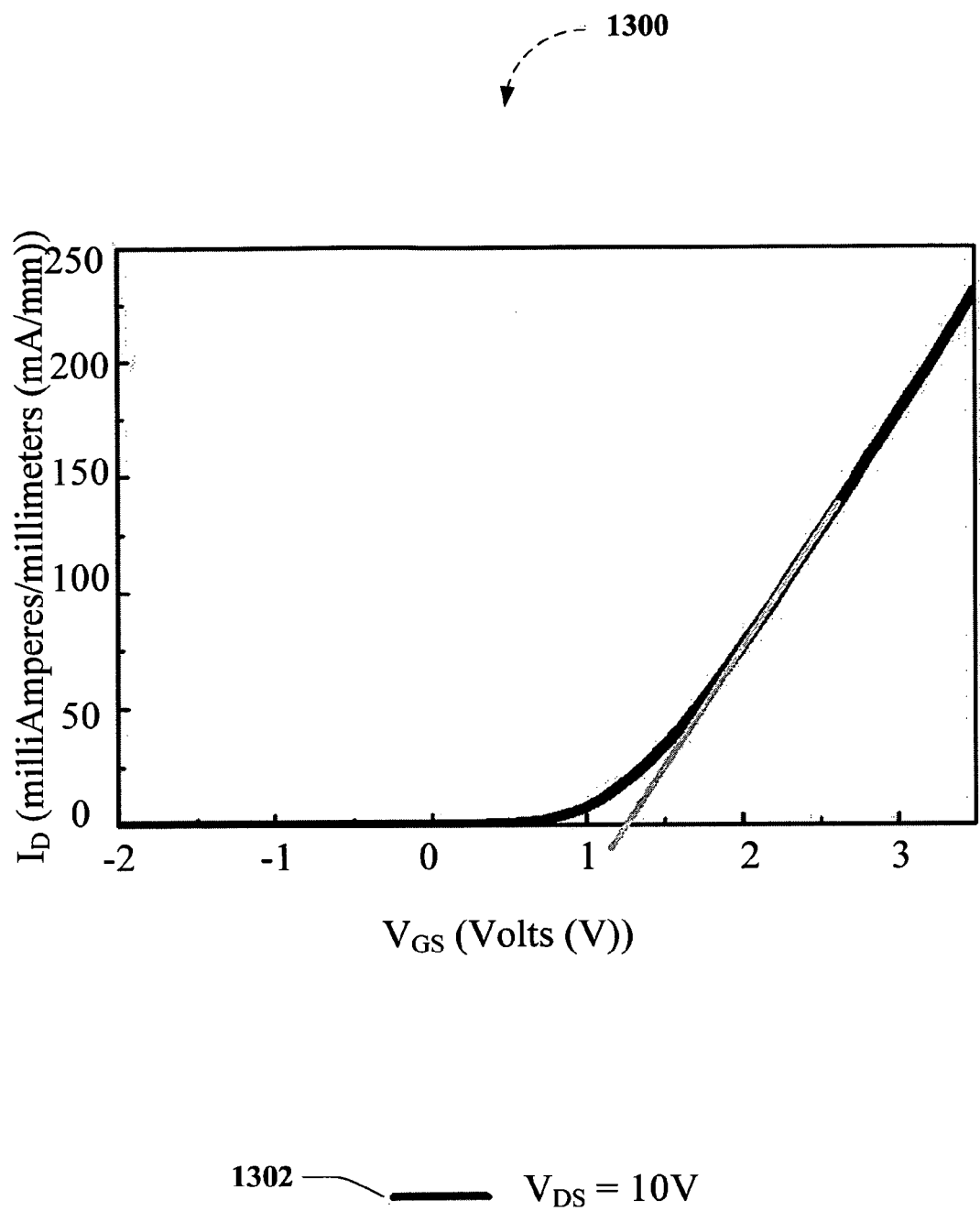
Figure 14:
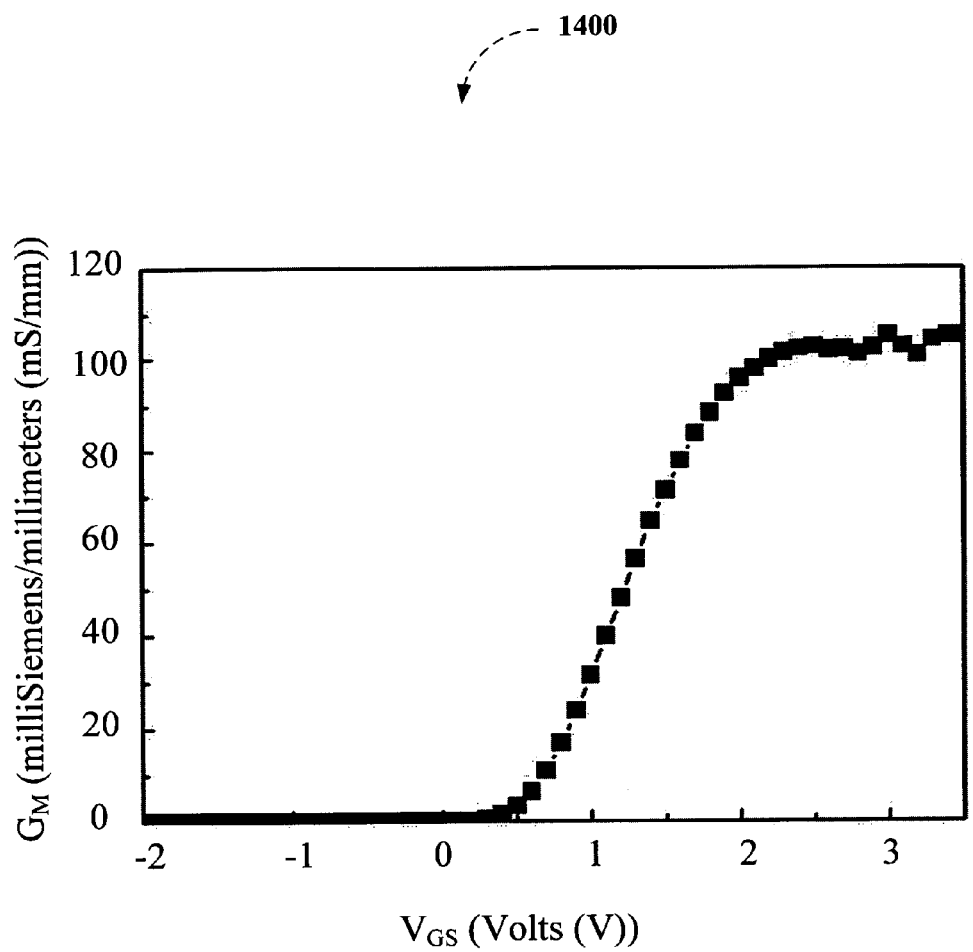

The measured characteristics of a particular non-limiting TJ-FET are demonstrated in FIGS. 11-20. For instance, according to an aspect, typical exemplary TJ-FETs according to aspects of the disclosed subject matter can feature an $I_{ON}/I_{OFF}$ ratio of $10^9$ at forward drain bias up to 50 V, a maximum drain current density of 230 mA/mm at $V_{GS}$=3.5 V, a threshold voltage of +1.22 V, a sub-threshold slope (SS) of 89 mV/decade, reverse break down voltages (BV) of 274 V for a device with 2 μm gate-drain distance and 557 V for a device with 15 μm gate-drain distance (at 0.1 mA/mm leakage current). From FIG. 16, it can be seen that no drain offset voltage is presented as a result of using an ohmic drain instead of Schottky drain in a particular non-limiting aspect. In addition, transconductance as shown in FIG. 14, is nearly flat (or constant) after reaching the peak, indicating excellent linearity.

Figure 11:
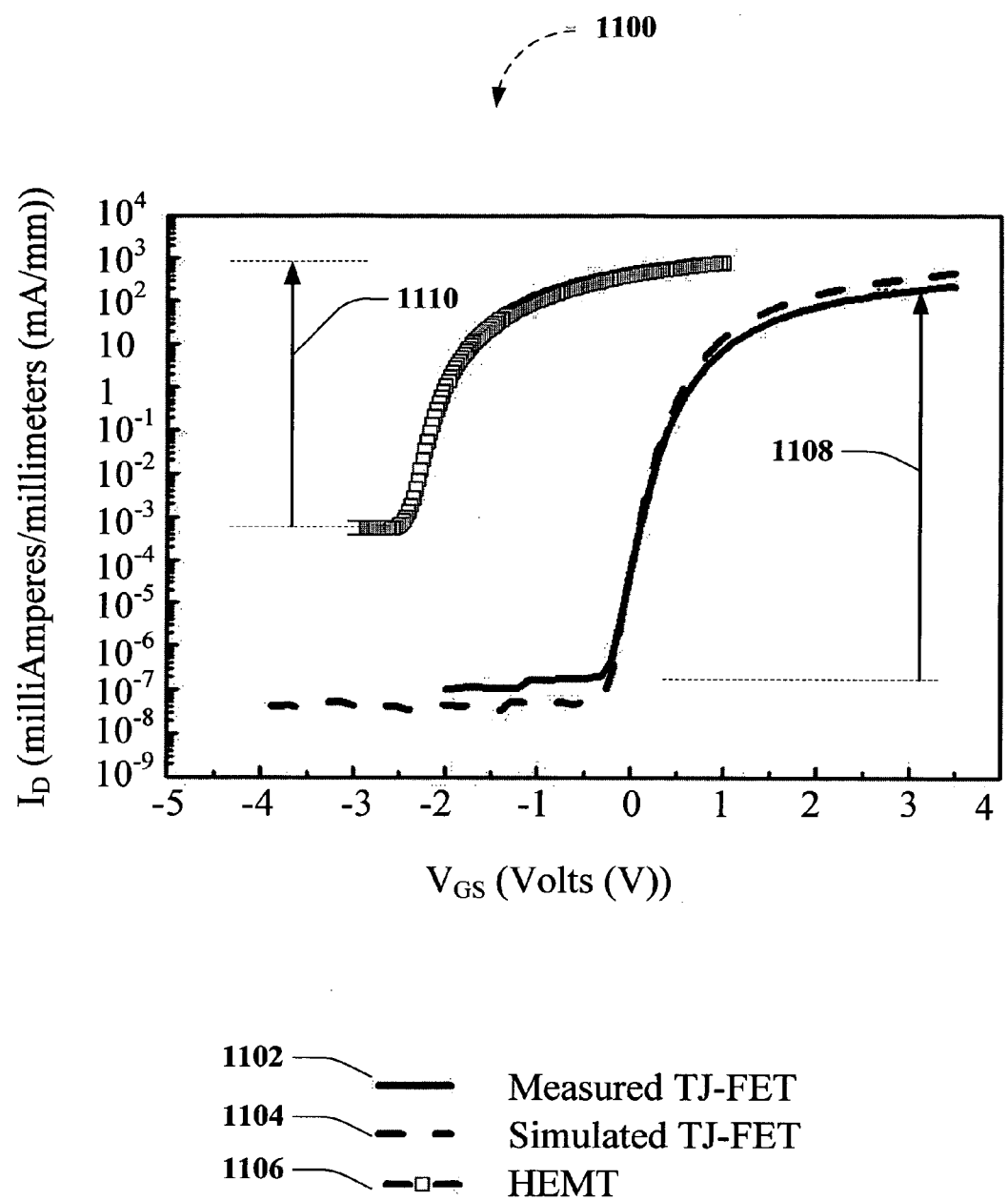
FIGS. 11-20 depict or tabulate measured characteristics of an exemplary non-limiting implementation of an AlGaN/GaN metal-2DEG TJ-FET according to various aspects of the disclosed subject matter.

Accordingly, FIGS. 11-20 depict measured characteristics of an exemplary non-limiting implementation of an AlGaN/GaN metal-2DEG TJ-FET according to various aspects of the disclosed subject matter. For instance, FIG. 11 depicts experimentally measured $I_D$-$V_{GS}$ profiles for an exemplary non-limiting TJ-FET (1102), an exemplary simulated TJ-FET (1104), and a conventional HEMT (1106) at $V_{DS}$=10 V, and fabricated on the same type of AlGaN/GaN wafer with gate width $W_G$=10 μM, gate length $L_G$=2 μm, and gate-drain spacing $L_{GD}$=2 μm. From FIG. 11, it can be seen that the measured results 1102 are in close agreement with the simulated results 1104 in terms of the gate turn-on voltage. In addition, the threshold voltage is positive, illustrating the TJ-FET's normally-off operation according to various embodiments.

The different threshold voltages in the TJ-FET (1102, 1104) and HEMT (1106) clearly exhibit the different mechanisms in the current turn-on. For instance, low off-state leakage current of $1 \times 10^{-7}$ mA/mm (e.g., approximately 1 pico-Ampere (pA)) can be obtained with a maximum drain current of 230 mA/mm at $V_{DS}$=3.5 V. In addition, the $I_{on}/I_{off}$ ratio 1108 of TJ-FET 1102/1104 is $10^9$, or about three orders of magnitude higher than that 1110 ($10^6$) achieved in conventional a HEMT 1106 fabricated on the same epitaxial wafer. Thus, this clearly illustrates the advantageous leakage suppression by the reverse biased source Schottky junction. Further exemplary device performance characteristics for particular non-limiting implementations of an AlGaN/GaN TJ-FET and a HEMT fabricated on the type same substrate are tabulated in FIG. 18.

FIG. 12 depicts the experimentally measured $I_D$-$V_{GS}$ characteristics of an exemplary non-limiting TJ-FET at different $V_{DS}$ (indicated as reference characters 1202-1212). Note that the off state leakage current exhibits little change as $V_{DS}$ varies from 1 V to 50 V. Note that the off-state $I_D$ keeps stable until $V_{DS}$ is larger than 50 V (e.g., when the gate insulator layer is expected to become leaky), indicating that the drain induced barrier lowering (DIBL) effect is sufficiently reduced.

FIG. 13 depicts the experimentally measured $I_D$-$V_{GS}$ profiles of an exemplary non-limiting TJ-FET in linear scale at $V_{DS}$=10 V. Note that the threshold voltage of TJ-FET is about +1.22 V, presenting the TJ-FET as a normally-off transistor. FIG. 14 depicts corresponding transconductance $G_m$-$V_{GS}$ profiles of an exemplary non-limiting metal-2DEG TJ-FET with $W_G$=10 um, $L_G$=2 um and $L_{GD}$=2 um at $V_{DS}$=10 V. Note that, according to an aspect, at $V_{DS}$=10 V, Gm could be stabilized at 100-105 milliSiemens/mm (mS/mm) when $V_{GS}$ is 2 V to 3.5 V, which indicates good linearity in input-output transfer relation.

Figure 15:
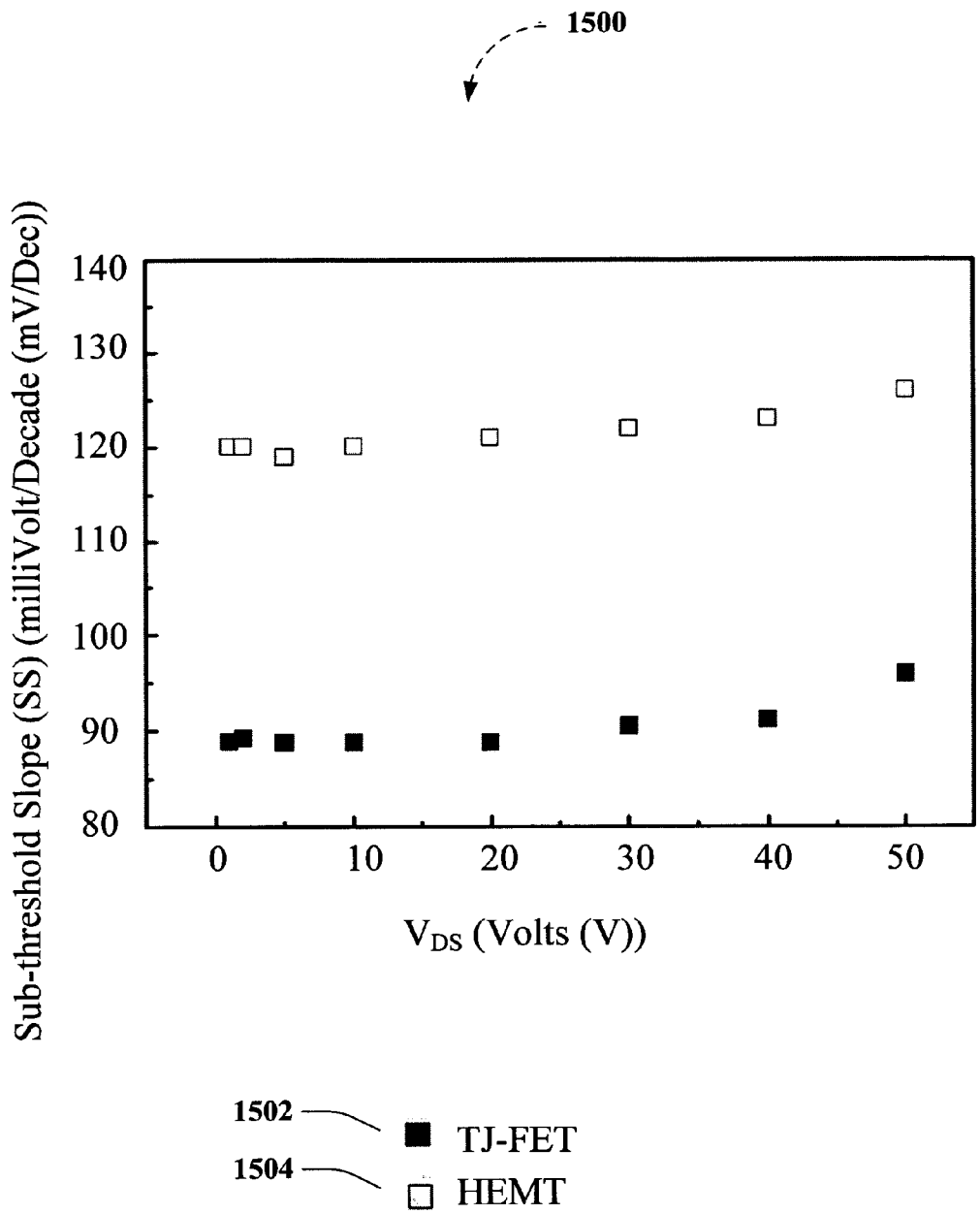
Figure 16:
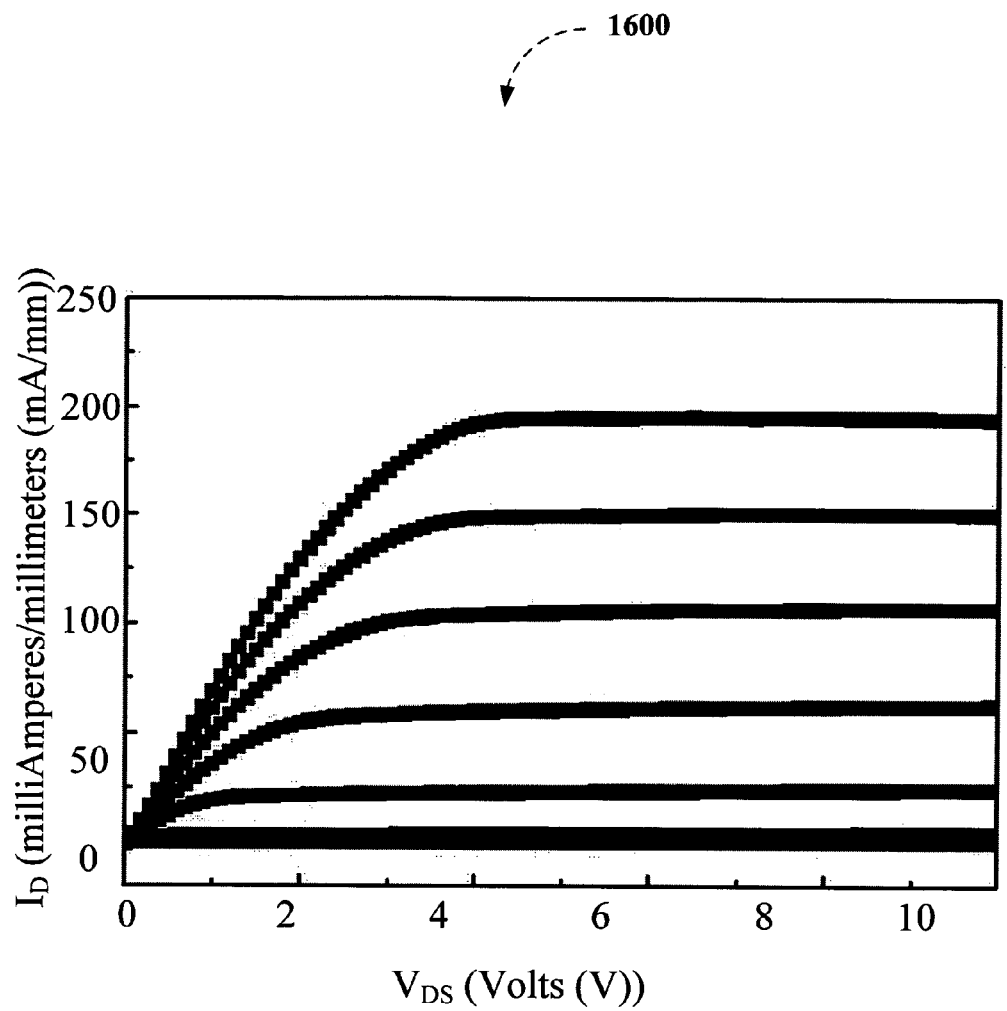

FIG. 15 depicts the experimentally measured sub-threshold slope (SS) $V_{DS}$ profiles of an exemplary non-limiting TJ-FET 1502 and a HEMT 1504 with gate width $W_G$=10 μm, gate length $L_G$=2 μm, and gate-drain spacing $L_{GD}$=2 μm. TJ-FET 1502 shows significantly lower SS than the conventional HEMT. FIG. 16 depicts the experimentally measured $I_D$-$V_{DS}$ profiles of an exemplary non-limiting TJ-FET with gate width $W_G$=10 μm, gate length LG=2 μm, and gate-drain spacing $L_{GD}$=2 μm.

Figure 17:
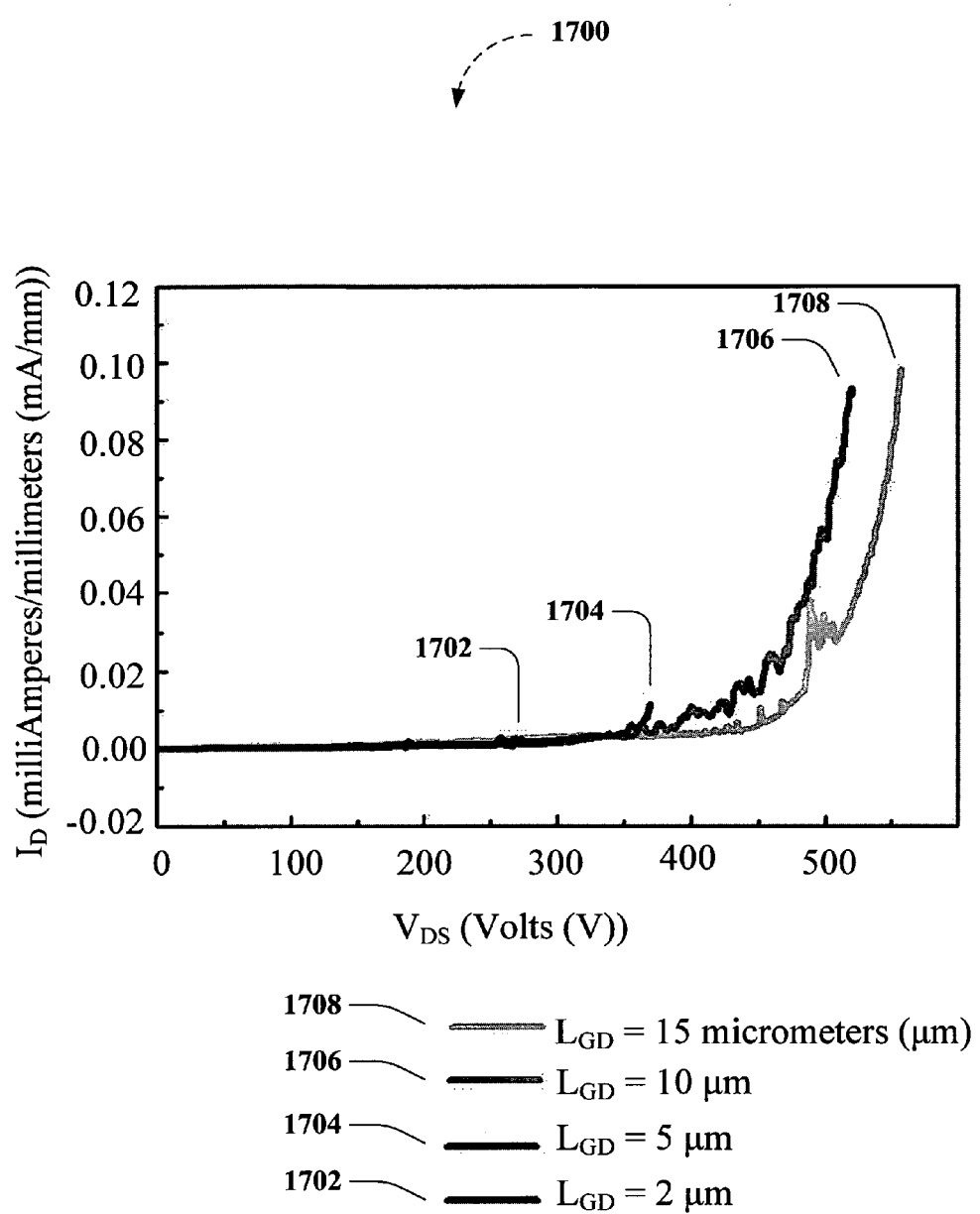

FIG. 17 depicts the experimentally measured $I_D$-$V_{DS}$ profiles of exemplary non-limiting TJ-FETs with a gate width $W_G$=10 μm, a gate length $L_G$=2 μm, and a gate-drain spacing $L_{GD}$=2, 5, 10, and 15 μm at pinch-off, and with breakdown drain current limit of 0.1 mA/mm. It can be seen from FIG. 17 that at relatively short $L_{GD}$ (2 μm) 1702, the exemplary TJ-FET delivers breakdown voltage more than 2 times of conventional HEMTs. This is due in part to the fact that the pinch-off in the exemplary TJ-FET starts at the source tunnel junction, while the pinch-off of HEMT starts at the gate edge at the drain side. Therefore, the effective distance between the starting pinch-off region and the drain terminal is larger in TJ-FET than in HEMT. When $L_{GD}$ is larger (5 (1704), 10 (1706), and 15 (1708) pin), the difference of the breakdown voltage (274V, 369V, 521V, 557V for $L_{GD}$=2, 5, 10, and 15 respectively) between an exemplary TJ-FET and HEMT becomes smaller. It is further noted that the specific on resistance ($R_{ON}$) of exemplary TJ-FETs with $L_{GD}$=2, 5, 10 and 15 μm are measured to be 0.69, 1.06, 1.66 and 2.74 milliohm (mΩ)·cm², respectively.

Figure 18:
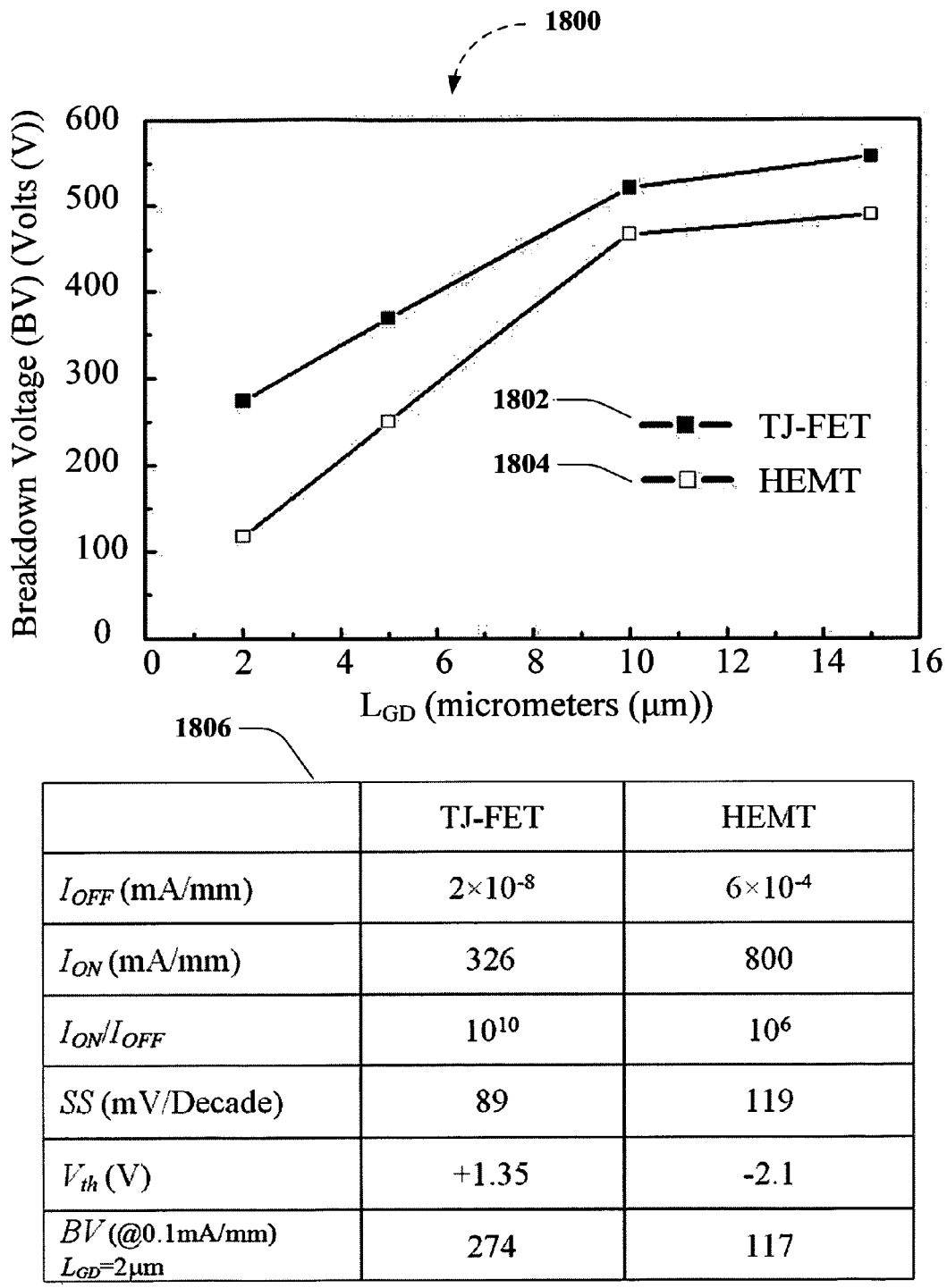
Figure 19:
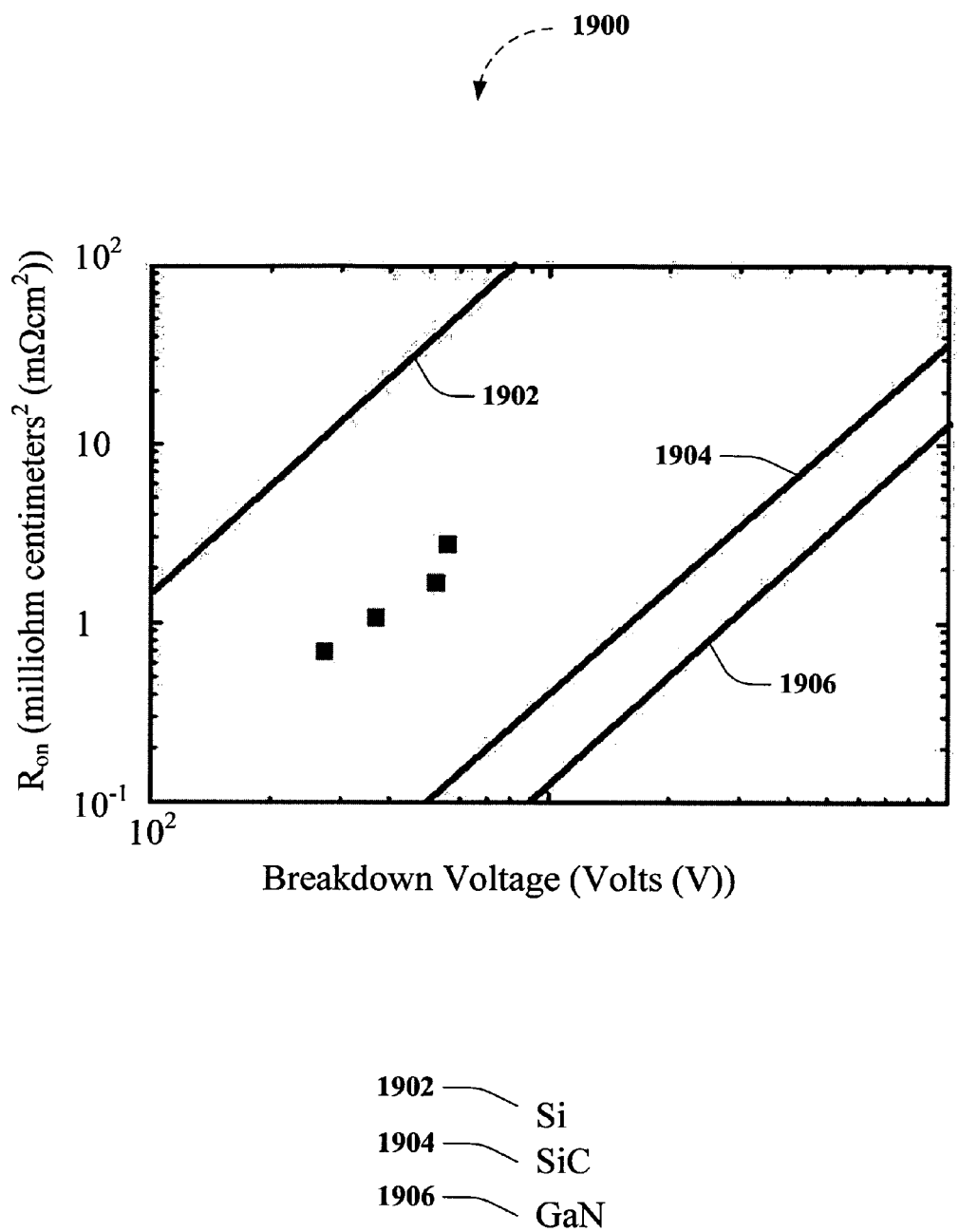
Figure 20:
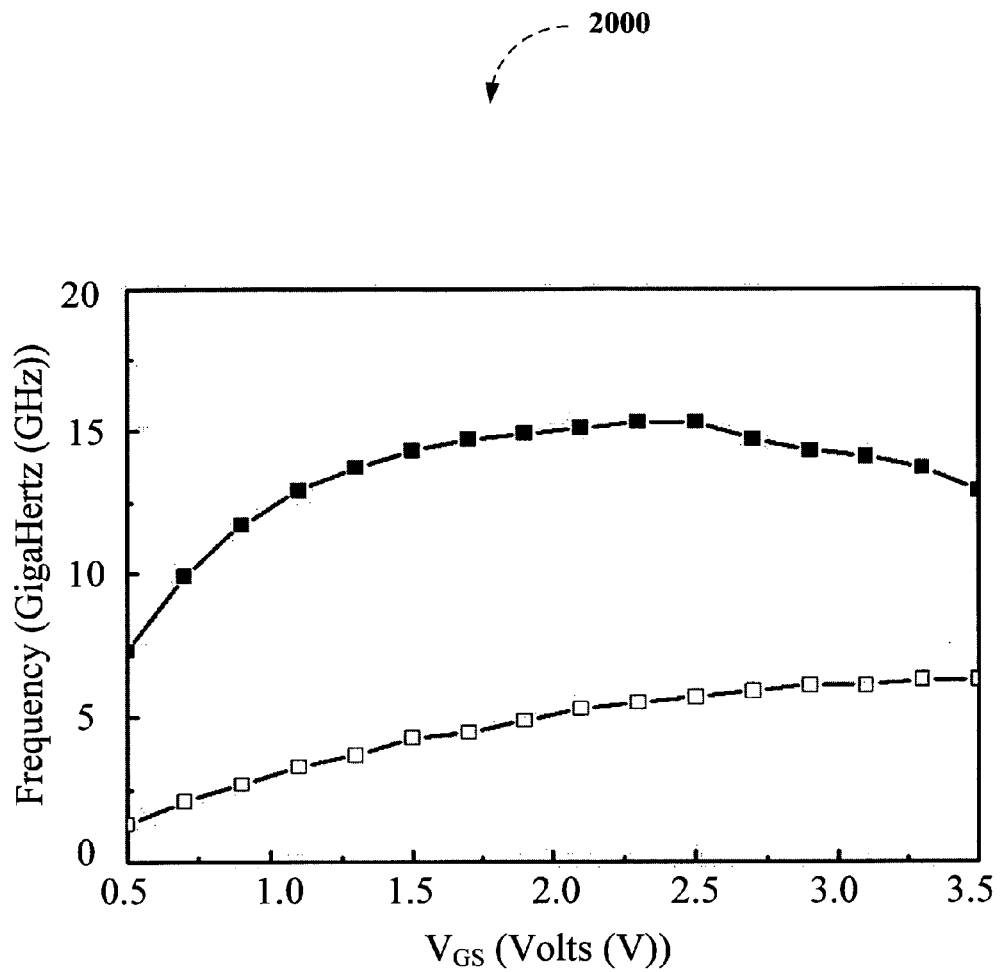

FIG. 18 depicts the break down voltage comparison between an exemplary non-limiting TJ-FET 1802 and a conventional HEMT 1804 fabricated on the same AlGaN/GaN wafer with different $L_{GD}$. In addition, FIG. 18 tabulates 1806 exemplary device performance characteristics for particular non-limiting implementations of an AlGaN/GaN TJ-FET and a HEMT fabricated on the type same substrate. FIG. 19 demonstrates the trade-off characteristics 1900 between specific on-resistance $R_{ON}$ and breakdown voltage of an exemplary non-limiting AlGaN/GaN TJ-FET with different $L_{GD}$, in comparison with the theoretical Si (1902), SiC (1904) and GaN (1906) limits. FIG. 20 illustrates the experimentally measured current gain cutoff frequency $f_T$ 2002 and power gain cutoff frequency $f_{max}$ 2004 of an exemplary non-limiting TJ-FET with gate width $W_G$=100 μm, gate length $L_G$=2 μm, and gate-drain spacing $L_{GD}$=2 μm. For instance, with $L_G$=2 μm, the maximum $f_T$ is 6.3 GHz and the maximum $f_{max}$ is 15.3 GHz.

While the disclosed subject matter has been described above in connection with various embodiments, it is to be understood that other similar embodiments may be used with, or modifications and additions may be made to, the described embodiments for performing the same or similar functions as described herein without deviating from the disclosed subject matter.

Further Non-Limiting Embodiments of TJ-FETs

In a further non-limiting aspect, the disclosed subject matter provides using metal as a drain electrode in addition to using metal as a source electrode. That is, drain electrode(s) can be formed by either ohmic contact or Schottky contact. It can be understood that while ohmic drain configuration can avoid voltage offset associated with the drain Schottky junction and maintains high current drive capability, the Schottky drain can provide a reverse drain blocking capability.

Figure 21:
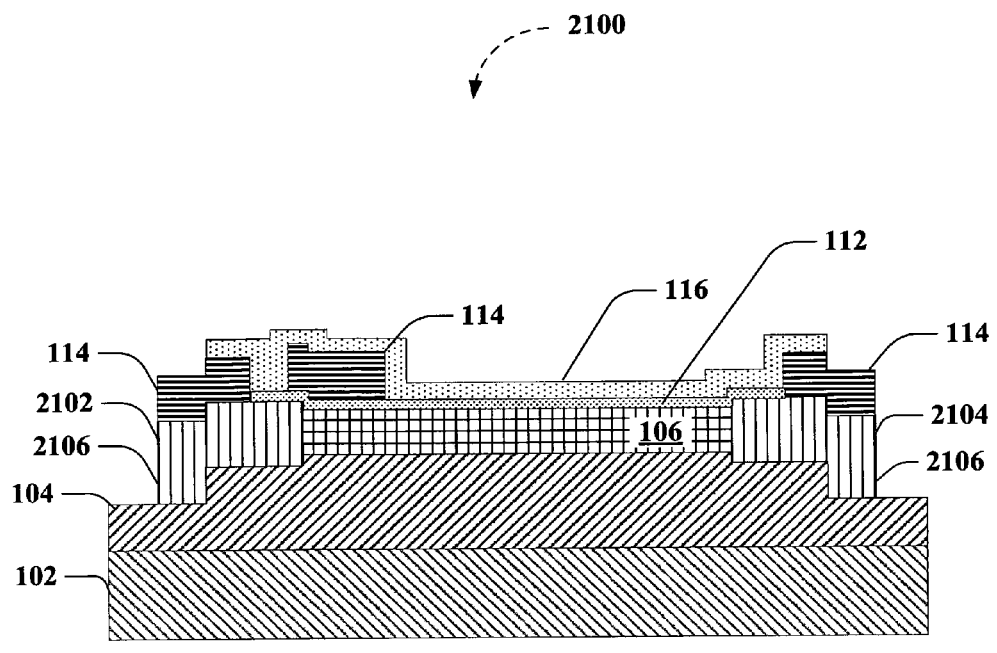
FIG. 21 illustrates a cross section of an exemplary non-limiting III-nitride TJ-FET featuring a Schottky contact at both the source and drain electrodes according to further aspects of the disclosed subject matter.

For example, FIG. 21 illustrates a schematic cross section of further non-limiting III-nitride TJ-FET 2100 featuring a Schottky contact at both the source (Schottky source contact 2102) and drain electrodes (Schottky drain contact 2104) according to further aspects of the disclosed subject matter. For ease of explanation and not limitation, FIG. 21 uses similar nomenclature as that for FIGS. 1-6 to depict similar functional characteristics or features as that described above, for example, regarding FIGS. 1-6, etc. Using terminology similar to that of FIGS. 1-6, while highlighting features of the various embodiments set forth herein, FIG. 21 depicts a cross-section of Schottky drain TJ-FET 2100. For instance, as compared to the ohmic drain TJ-FET 600 of FIG. 6, Schottky drain TJ-FET 2100 can include metallization of the drain electrode.

For example, as can be seen in FIG. 21, the symmetrical metal-2DEG source metal-2DEG drain tunnel junction FET features metal-2DEG junctions at both the source 2102 and drain 2104 electrodes. This device features a metal layer 2106 (e.g., with single or multiple metal layers of one or more of Ti, Al, Cr, Ni, Pt, Au, etc.) used for source 2102 and drain 2104 electrodes. In a non-limiting aspect, the prospective source 2102 and drain 2104 regions can be recessed to semiconductor layer 104 by dry or wet etching techniques, before the metal deposition. It can be understood that according to various embodiment as described herein, such source 2102 and drain 2104 metallic electrodes are in Schottky contact with the 2DEG to form both source 2102 and drain 2104 contacts.

It should be noted that yet other configurations, arrangements, structures, and embodiments are possible according to the disclosed subject matter. For example, the exemplary TJ-FETs described above relate to lateral device construction and operation in which the current path is exemplified by traveling through the source metal-2DEG tunnel junction and the 2DEG channel. According to various aspects, TJ-FETs can also be implemented according to vertical structures and operation, in which the drain terminal is formed to a conducting layer under the 2DEG channel, but separated from the 2DEG channel (e.g., by an undoped GaN spacer, a lightly doped acceleration layer, etc.) as described below.

For instance, according to further non-limiting implementations, a tunnel junction FET can also be implemented in a vertical structure, for example, with the drain electrode contacting a nitride semiconductor layer located below the heterojunction. In such a non-limiting example, the current flow path can comprise lateral tunneling through a metal-2DEG junction and vertically transporting through a spacer layer. It can be understood that a major advantage of a vertical tunnel junction FET is the elimination of current collapse, which can occur in lateral devices such as AlGaN/GaN HEMT as a result of the surface states in the gate-drain region.

Figure 22:
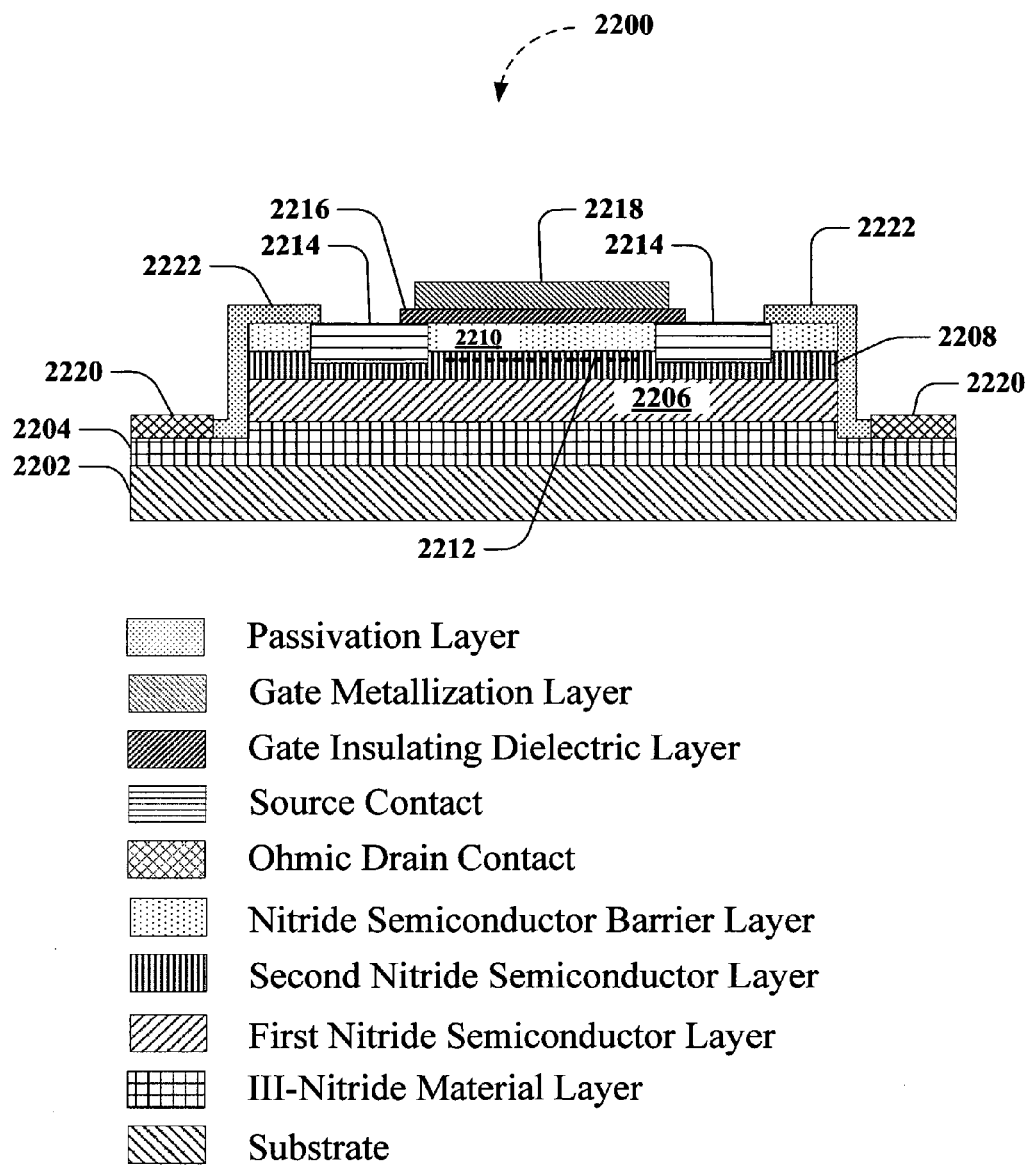
FIGS. 22-25 depict several cross-sections of further non-limiting vertical TJ-FET (VTJ-FET) structures in accordance with aspects of the disclosed subject matter.

As further examples, FIGS. 22-25 depict several cross-sections of further non-limiting vertical TJ-FET (VTJ-FET) structures in accordance with aspects of the disclosed subject matter. For instance, FIG. 22 shows the schematic cross-section of an exemplary vertical tunnel junction field effect transistors (VTJ-FET) 2200 realized on III-nitride semiconductor materials, having drain electrodes located at the front side of the starting wafer.

Using terminology similar to that of FIGS. 1-6, and 21, while highlighting features of the various embodiments set forth herein FIG. 22 depicts a substrate layer 2202 (e.g., Si, SiC, Sapphire, or GaN, etc.) upon which can be formed a group III-nitride material layer 2204 (e.g., n-type heavily doped GaN in the range of $10^{18}$ cm$^{-3}$ or higher, etc.). According to a non-limiting aspect, a first nitride semiconductor layer 2206 (e.g., n-type lightly-doped GaN in the range of $10^{16}$ cm$^{-3}$) can be formed on the group III-nitride material layer 2204. In a further aspect, a second nitride semiconductor layer 2208 (e.g., undoped GaN, etc.) can be formed on the nitride semiconductor layer 2206. According to further non-limiting implementations, a nitride semiconductor barrier layer 2210 (e.g., Al$_X$Ga$_{1-X}$N (0<X≤1)) can be formed on second nitride semiconductor layer 2208. It can be understood that a polarization charge can generated by spontaneous and piezoelectric polarization of the nitride semiconductor material, at the interface between second nitride semiconductor layer 2208 and nitride semiconductor barrier layer 2210.

As a result of the polarization charge, a 2DEG 2212 can be formed in the vicinity between second nitride semiconductor layer 2208 and nitride semiconductor barrier layer 2210. In further non-limiting implementations, a source contact 2214 (e.g., a Schottky contact) can be formed in the recessed region of nitride semiconductor barrier layer 2210 and second nitride semiconductor layer 2208. In addition, according to a further aspect, a dielectric layer (e.g., gate insulating dielectric layer 2216), such as, for example, silicon nitride, aluminum oxide, etc., can be formed on the nitride semiconductor barrier layer 2210 and source contact 2214.

In yet other aspects, non-limiting implementations of an exemplary VTJ-FET can comprise a gate contact layer (e.g., gate metallization layer 2218, etc.), such as, for example, a Ni and Au metal stack, that can be formed on the dielectric layer (e.g., gate insulating dielectric layer 2216). In further exemplary embodiments, a drain contact layer 2220, such as, for example, an ohmic metal stack comprising any combination of Ti, Al, Ni, and Au, and so on, can be formed on the concaved surface of group III-nitride material layer 2204. In still other non-limiting implementations, a passivation or protection layer (e.g., passivation layer 2222, etc.), such as, for example, a passivation layer comprised of SiN, can be formed on the exposed device surface, such as on exposed surfaces of one or more of group III-nitride material layer 2204, first nitride semiconductor layer 2206, second nitride semiconductor layer 2208, and nitride semiconductor barrier layer 2210, etc.

Figure 23:
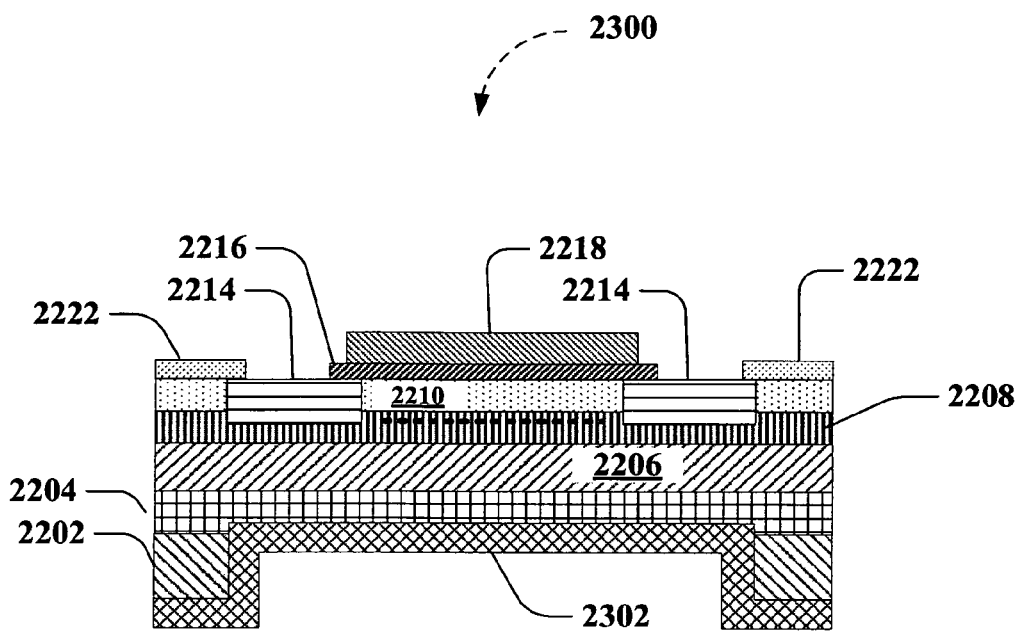

As another example, FIG. 23 illustrates a schematic cross-section of an exemplary tunnel junction field effect transistors (VTJ-FET) 2300 having drain electrodes located at the backside of an etched substrate layer. For instance, according to a particular non-limiting implementation, the VTJ-FET 2300 of FIG. 23 can comprise analogous structures as that for VTJ-FET 2200, except for the formation of a drain contact layer 2302. Accordingly, for ease of explanation and not limitation, FIG. 23 uses similar reference characters and/or nomenclature as that for FIG. 22 to depict similar functional characteristics or features as that described above, for example, regarding FIGS. 1-6, 22, etc.

Thus, for VTJ-FET 2300, a drain contact layer (e.g., ohmic drain contact 2302), such as a Ti, Al, Ni, Au ohmic metal stack, for example, can be formed on a back surface of group III-nitride material layer 2204. Drain contact layer (e.g., ohmic drain contact 2302), according to an aspect, can also touch the exposed surface of substrate 2202 layer. It can be understood that one approach to form the drain contact layer (e.g., ohmic drain contact 2302) related concave region is to remove substrate 2202 layer and part of group III-nitride material layer 2204, using masked wet or dry etching, as a non-limiting example.

Figure 24:
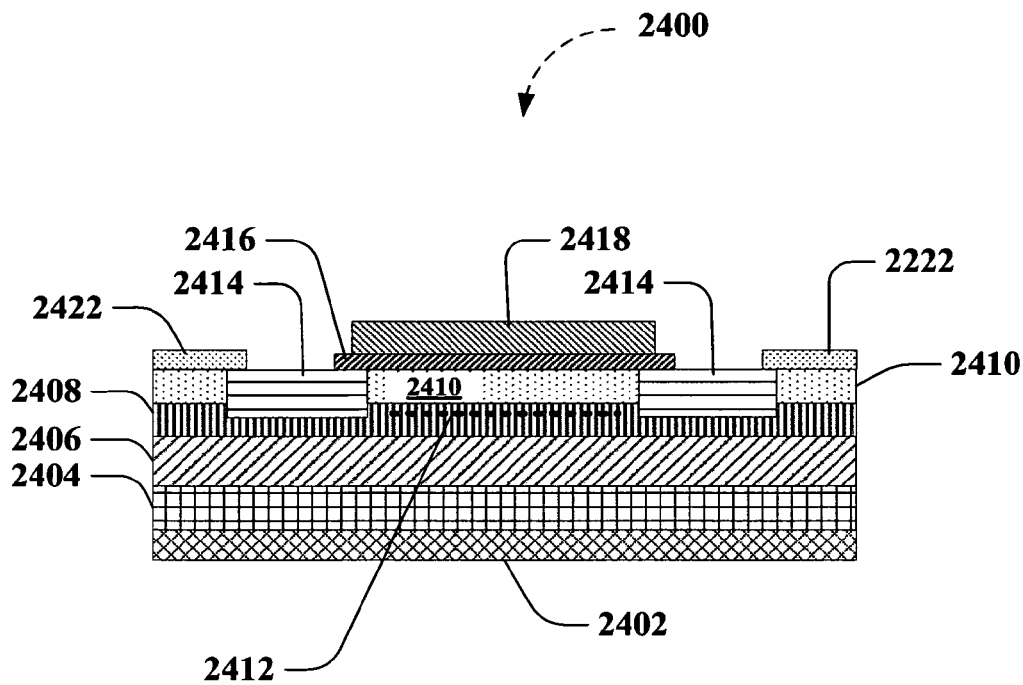

As a further non-limiting example of VTJ-FET structures, FIG. 24 depicts a schematic cross-section of an exemplary VTJ-FET 2400 having drain electrodes (e.g., ohmic drain contact 2402) located at the bottom of the substrate 2404. As described above, FIG. 24 uses similar reference characters and/or nomenclature as that for FIGS. 22-23 to depict similar functional characteristics or features as that described above, for example, regarding FIGS. 1-6, 22-23, etc., for ease of explanation and not limitation.

Accordingly, FIG. 24 illustrates VTJ-FET 2400 employing group III-nitride material layer 2404 to serve as a substrate. For example, in various embodiments, VTJ-FET 2400 can employ an n-type heavily doped GaN (e.g., doped in the range of $10^{18}$ cm$^{-3}$ or higher, etc.) group III-nitride material layer 2404. In a further aspect, a first nitride semiconductor layer 2406 (e.g., an n-type lightly-doped GaN in the range of $10^{16}$ cm$^{-3}$) can be formed on the group III-nitride material substrate layer 2404. A second nitride semiconductor layer 2408 (e.g., such as undoped GaN) can be formed on first nitride semiconductor layer 2406.

In yet another aspect, VTJ-FET 2400 can comprise a nitride semiconductor barrier layer 2410 (e.g., a barrier layer comprised of $Al_xGa_{1-x}N$ (0<x≤1)), which can be formed on second nitride semiconductor layer 2408, as described above. As further described above, it can be understood that a polarization charge can be generated by spontaneous and piezoelectric polarization of the nitride semiconductor material, at an interface at the boundary between second nitride semiconductor layer 2408 and nitride semiconductor barrier layer 2410. As a result of the polarization charge, a two dimensional electron gas (2DEG) 2412 can form in the vicinity between second nitride semiconductor layer 2408 and nitride semiconductor barrier layer 2410. According to yet another aspect, a source contact 2414 (e.g., a Schottky contact, etc.) can be formed in the concave region of second nitride semiconductor layer 2408 and nitride semiconductor barrier layer 2410.

In addition, according to various embodiments a gate insulating dielectric layer 2416 (e.g., a SiN, $Al_2O_3$, dielectric layer etc.) can be formed on nitride semiconductor barrier layer 2410 and source contact 2414, as further described above. In various non-limiting implementations, VTJ-FET 2400 can further comprise a gate contact layer (e.g., gate metallization layer 2418, etc.), such as described above (e.g., a Ni, Au metal stack) that can be formed on gate insulating dielectric layer 2416. Furthermore, a drain contact layer (e.g., ohmic drain contact 2402) can be formed on the backside of group III-nitride material substrate layer 2404 (e.g., an ohmic metal stack such comprised of any combination of Ti, Al, Ni, Au, etc.). In further non-limiting implementations, a passivation or protection layer (e.g., passivation layer 2422, such as SiN, etc.) can be formed on one or more exposed device surfaces, such as nitride semiconductor barrier layer 2410.

Figure 25:
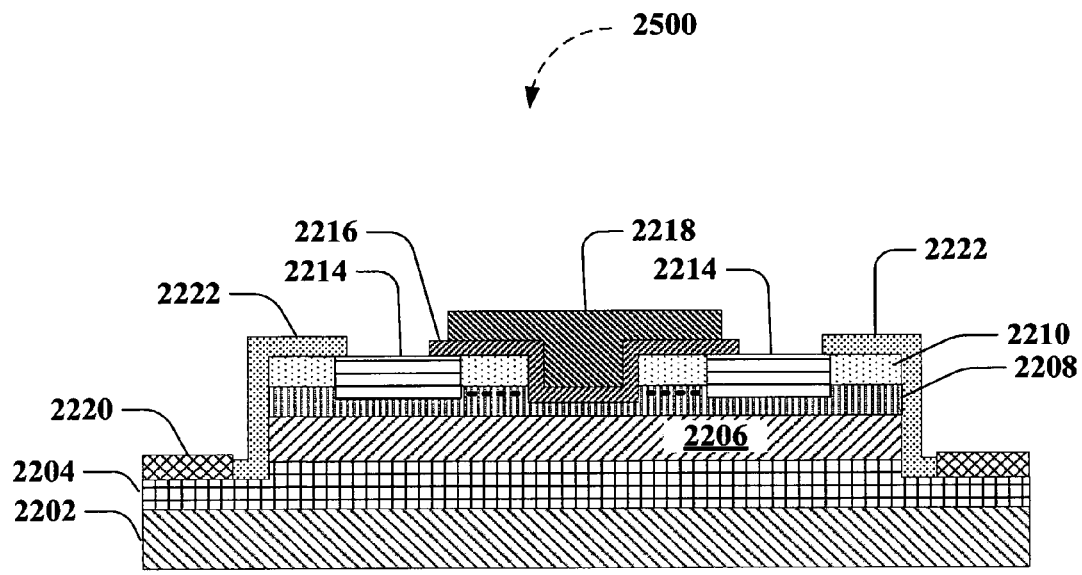

In yet another non-limiting example of VTJ-FET structures, FIG. 25 depicts a schematic cross-section of an exemplary VTJ-FET 2500 including a trench region comprising a portion of the associated gate electrode. For instance, according to further non-limiting implementations, VTJ-FET 2500 of FIG. 25 can comprise analogous structures as that for VTJ-FET 2200, except for the formation of a trench region comprising a portion of the associated gate electrode. Accordingly, for ease of explanation and not limitation, FIG. 25 uses similar reference characters and/or nomenclature as that for FIG. 22 to depict similar functional characteristics or features as that described above, for example, regarding FIGS. 1-6, 22, 23, etc.

As an example, FIG. 25 illustrates VTJ-FET 2500 having a portion of gate layer (e.g., gate metallization layer 2218 such as a Ni, Au metal stack, etc.) formed on a concave surface of nitride semiconductor barrier layer 2210 and a portion of second nitride semiconductor layer 2208. In addition, gate insulating layer (e.g., gate insulating dielectric layer 2216, such as an $Al_2O_3$ layer, etc.) can be formed between second nitride semiconductor layer 2208 and nitride semiconductor barrier layer 2210 and gate contact layer (e.g., gate metallization layer 2218). In a particular non-limiting implementation, a trenched region related to gate contact layer (e.g., gate metallization layer 2218) can be formed by removing portions of nitride semiconductor barrier layer 2210 and portions of second nitride semiconductor layer 2208, for example, using masked wet or dry etching. In further exemplary embodiments, a drain contact layer 2220, such as, for example, an ohmic metal stack comprising any combination of Ti, Al, Ni, and Au, and so on, can be formed on the concaved surface of group III-nitride material layer 2204.

Thus, it can be understood that for VTJ-FET 2300 and 2400 as depicted in FIGS. 23 and 24 respectively, part of gate contact layer (e.g., gate metallization layer 2218 and 2418) can also be formed on the concaved surface of nitride semiconductor barrier layer 2210 (nitride semiconductor barrier layer 2410 for VTJ-FET 2400) and part of second nitride semiconductor layer 2208 (second nitride semiconductor layer 2408 for VTJ-FET 2400). Advantageously, a trenched gate facilitates clamping (or fixing) of potential along the walls of the trenched region, which can beneficially result in the depletion of the region between the trenched-gate and source contacts. Thus, this depletion of the region between the trenched-gate and source contacts can result in enhanced off-state blocking capability.

Accordingly, the disclosed subject matter provides tunnel junction field-effect transistors TJ-FETs (e.g., a normally-off III-nitride AlGaN/GaN metal-2DEG TJ-FET 600, 2100 2200, 2300, 2400, 2500, etc.). According to an aspect, the TJ-FETs can comprise a substrate (e.g., substrate 102, 2202, 2404, etc.). For instance, as described above, suitable substrates can comprise sapphire, silicon (111), silicon carbide (SiC), aluminum nitride (AlN), or GaN, with or without a nucleation layer such as a nucleation layer comprised of a group III-nitride. For instance, in a particular non-limiting implementation, a TJ-FET can comprise a sapphire substrate.

In addition, exemplary TJ-FETs can include a buffer layer (e.g., III-nitride material buffer layer 104, first and second nitride semiconductor layers 2206/2208 (2406/2408), etc.) disposed or deposited on the substrate and a barrier layer a barrier layer (e.g., III-nitride semiconductor bather layer 106, nitride semiconductor bather layer 2210/2410, etc.) disposed or deposited on the buffer layer. According to various aspects, the buffer layer and the bather layer can form a heterojunction at an interface of the buffer layer and the bather layer, as further described above. In addition, the heterojunction can comprise a 2DEG conducting channel (e.g., a 2DEG conducting channel proximate to the prospective location for the gate).

In addition, exemplary TJ-FETs can further comprise a metal region adjacent to the buffer layer, proximate to the prospective location for the source, and spanning a portion of the heterojunction. For instance, regarding FIG. 6, 21-25, 33, etc. and related descriptions, as described above, the metallic Schottky source contact (e.g., Schottky source contact 110, source contact 2214/2414, etc.) can be deposited on the buffer layer and in Schottky contact to 2DEG. Thus, as further described above, the metallic source contact in Schottky contact with the 2DEG at the heterojunction can be said to span a portion of the heterojunction.

Still other non-limiting implementations of TJ-FETs can include an insulating dielectric layer (e.g., gate insulating dielectric layer 112, gate insulating dielectric layer 2216/2416, etc.) deposited above the barrier layer (e.g., III-nitride semiconductor barrier layer 106, nitride semiconductor barrier layer 2210/2410, etc.) proximate to the prospective location for the gate. In various embodiments, as described above, a gate (e.g., gate 602, etc.) can be formed above the insulating dielectric layer (e.g., gate insulating dielectric layer 112, gate insulating dielectric layer 2216/2416, etc.).

As further described herein, the gate can be further adapted to partially overlay a portion of the metal region proximate to the prospective location for the source (e.g., the metallic Schottky source contact, Schottky source contact 110, source contact 2214/2414, etc.) and electrically isolated from the metal region by the insulating dielectric layer. In yet other embodiments (e.g., VTJ-FET 2500) the gate can be further adapted to at least partially fill a trench etched in a portion of the barrier layer. In addition, according to various embodiments as described above, the drain with a TJ-FET can span a portion of the heterojunction and can be in at least one of ohmic contact or Schottky contact with the 2DEG. In other embodiments, (e.g., VTJ-FETs) the drain can be electrically coupled to the Schottky source across the heterojunction.

In yet other non-limiting implementations, normally-off metal two-dimensional electron gas tunnel junction field-effect transistors TJ-FETs (e.g., a normally-off III-nitride AlGaN/GaN metal-2DEG TJ-FET 2200, 2300, 2400, 2500, 3300, etc.) are provided that can comprise a second nitride semiconductor layer (e.g., second nitride semiconductor layer 2208/2408) deposited on a first nitride semiconductor layer (e.g., first nitride semiconductor layer 2206/2406). As a further example, such exemplary TJ-FETs can include a nitride semiconductor barrier layer (e.g., nitride semiconductor barrier layer 2210/2410) deposited on the second nitride semiconductor layer (e.g., second nitride semiconductor layer 2208/2408) and forming a heterojunction comprising a two-dimensional electron gas (2DEG) at an interface of the nitride semiconductor barrier layer and the second nitride semiconductor layer as described above.

In yet other non-limiting embodiments, the TJ-FETs can include one or more metallic source contact(s) associated with the metal-2DEG TJ-FET and in Schottky contact with the 2DEG. In still other implementations, the TJ-FETs can include one or more of an ohmic contact (e.g., ohmic drain contact 2220/2302/2402, etc.) or a Schottky drain contact electrically coupled to the one or more metallic source contact(s) across the heterojunction.

Figure 34:
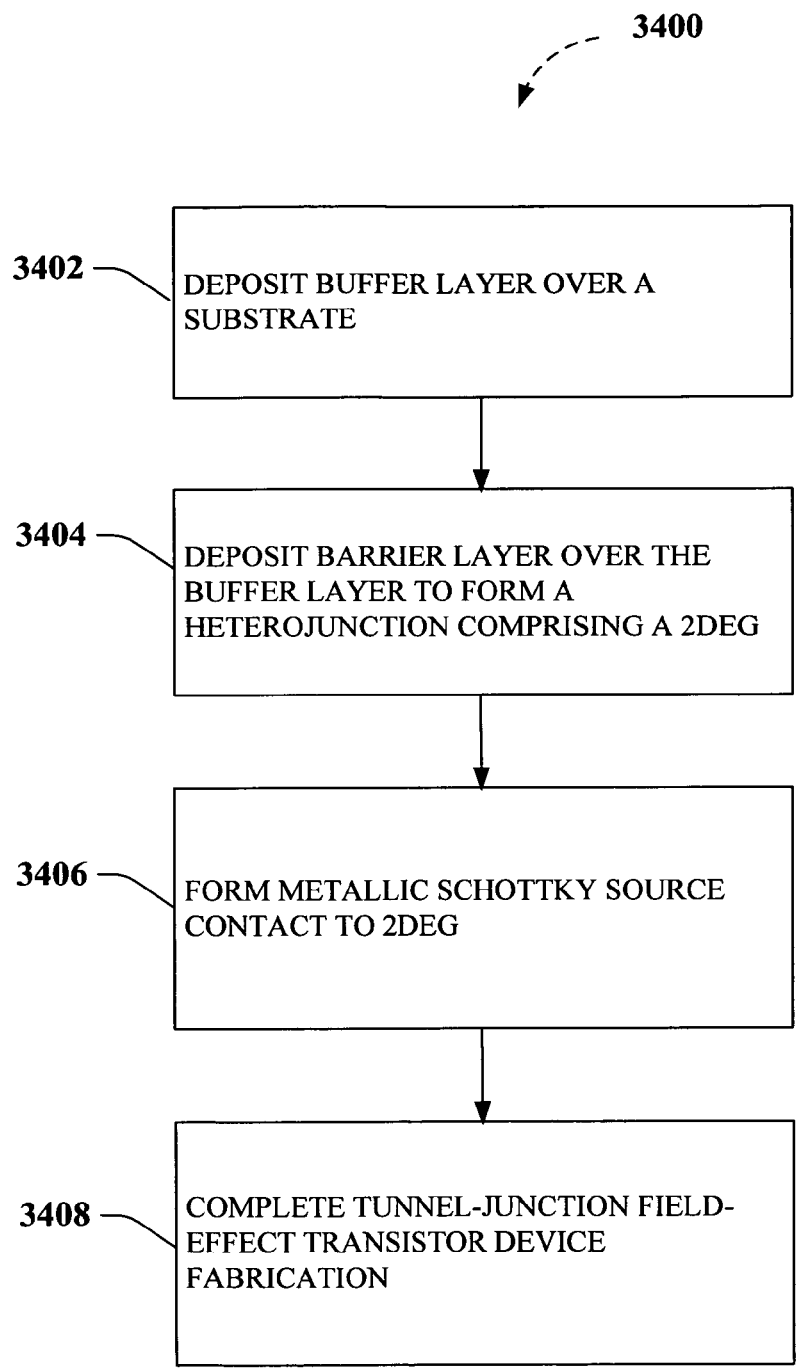
FIG. 34 depicts exemplary non-limiting methodologies for forming a TJ-FET in accordance with aspects of the disclosed subject matter.
Figure 35:
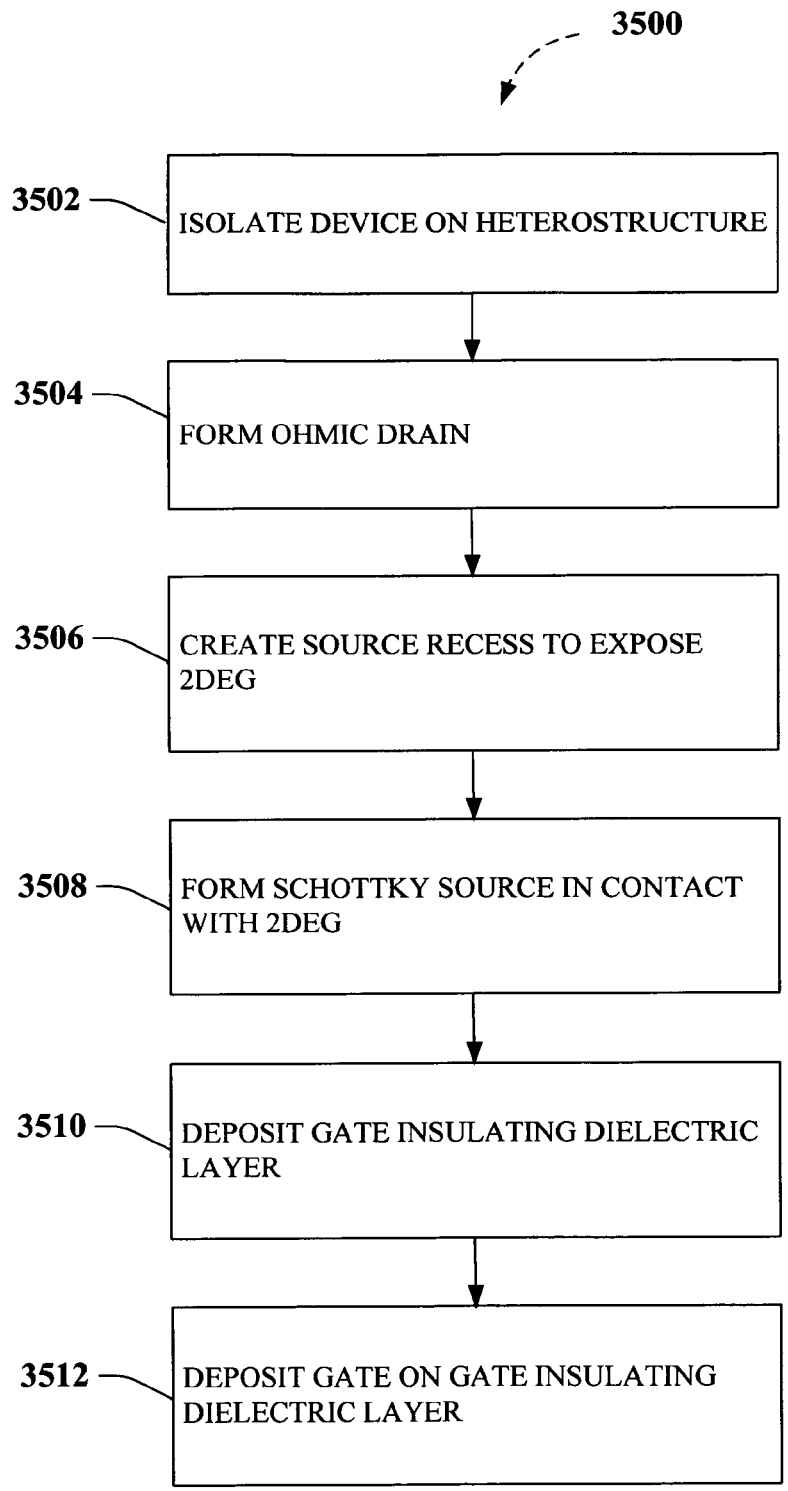
FIG. 35 depicts further non-limiting methodologies for forming a TJ-FET in accordance with aspects of the disclosed subject matter and with reference to various non-limiting embodiments of FIGS. 1-6.

In view of the structures and devices described supra, methodologies that can be implemented in accordance with the disclosed subject matter will be better appreciated with reference to the flowcharts of FIGS. 34-35. While for purposes of simplicity of explanation, the methodologies are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methodologies described hereinafter.

Exemplary Methodologies

FIGS. 26-33 depict various aspects of an exemplary non-limiting VTJ-FET, for example, such as exemplary VTJ-FET depicted in FIG. 22 at different stages of an exemplary fabrication process. It should be understood that the various stages are depicted for ease of explanation and not limitation. For instance, it can be understood that such illustrations or corresponding descriptions are not limited by the number, order, or lack of inclusion of particular stage, as some stages may occur in different orders and/or concurrently with other stages from what is depicted and described herein. In other instances, suitable alternatives or arrangements for fabricating a particular feature or accomplishing a particular function can be devised that can be substituted for one or more stages or added thereto. Accordingly, the following description is merely intended to describe a subset of possible alternatives enabled by the disclosed structures, devices, and methodologies as described herein.

Figure 26:
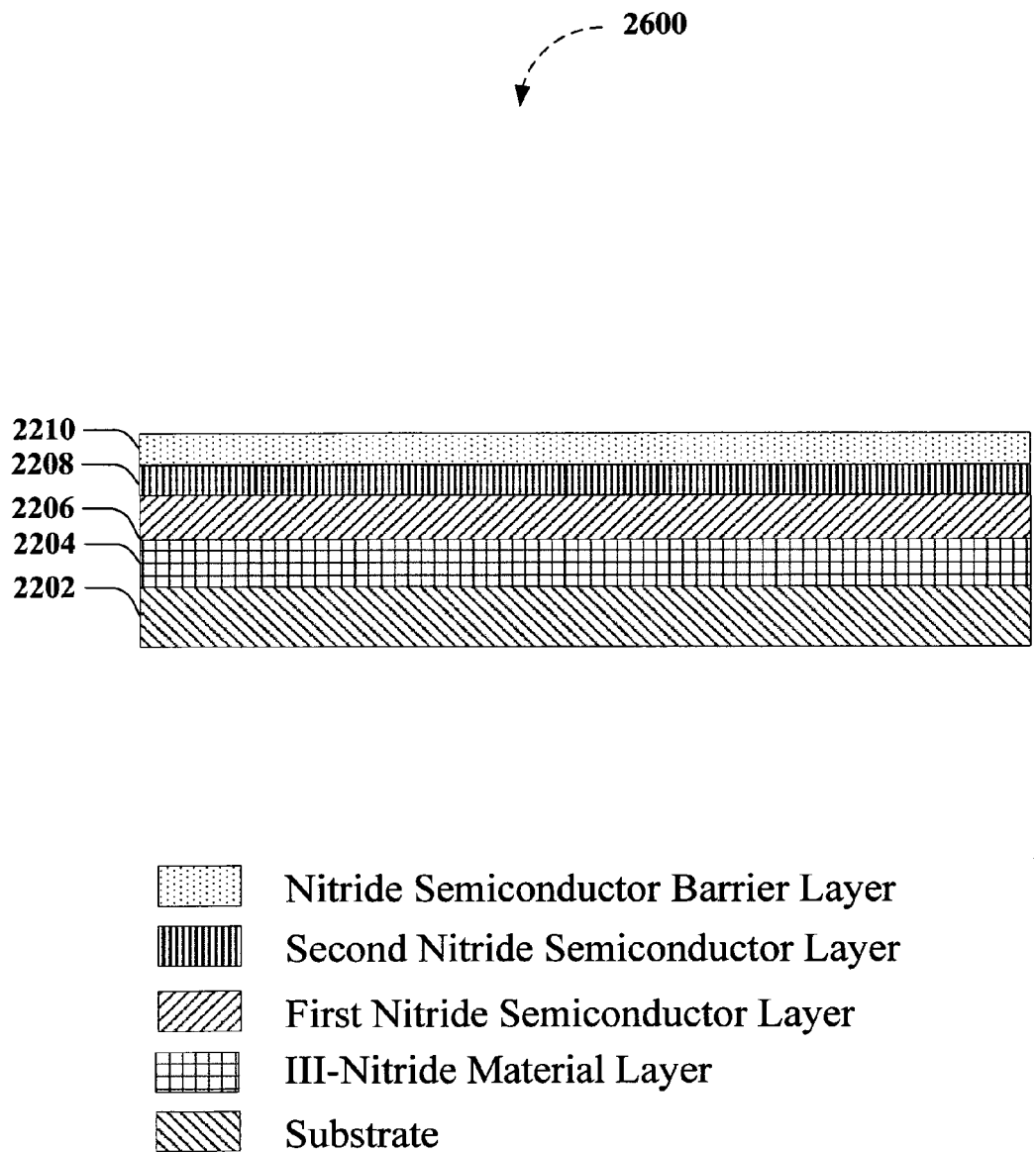
FIGS. 26-33 depict various aspects of an exemplary non-limiting VTJ-FET as depicted in FIG. 22 at different stages of an exemplary fabrication process.

As a non-limiting example, FIG. 26 shows an example of the starting sample wafer, including a substrate 2202, a group III-nitride material layer 2204, a first nitride semiconductor layer 2206, a second nitride semiconductor layer 2208, and a nitride semiconductor barrier layer 2210, for example, as previously described in reference to FIG. 22.

Figure 27:
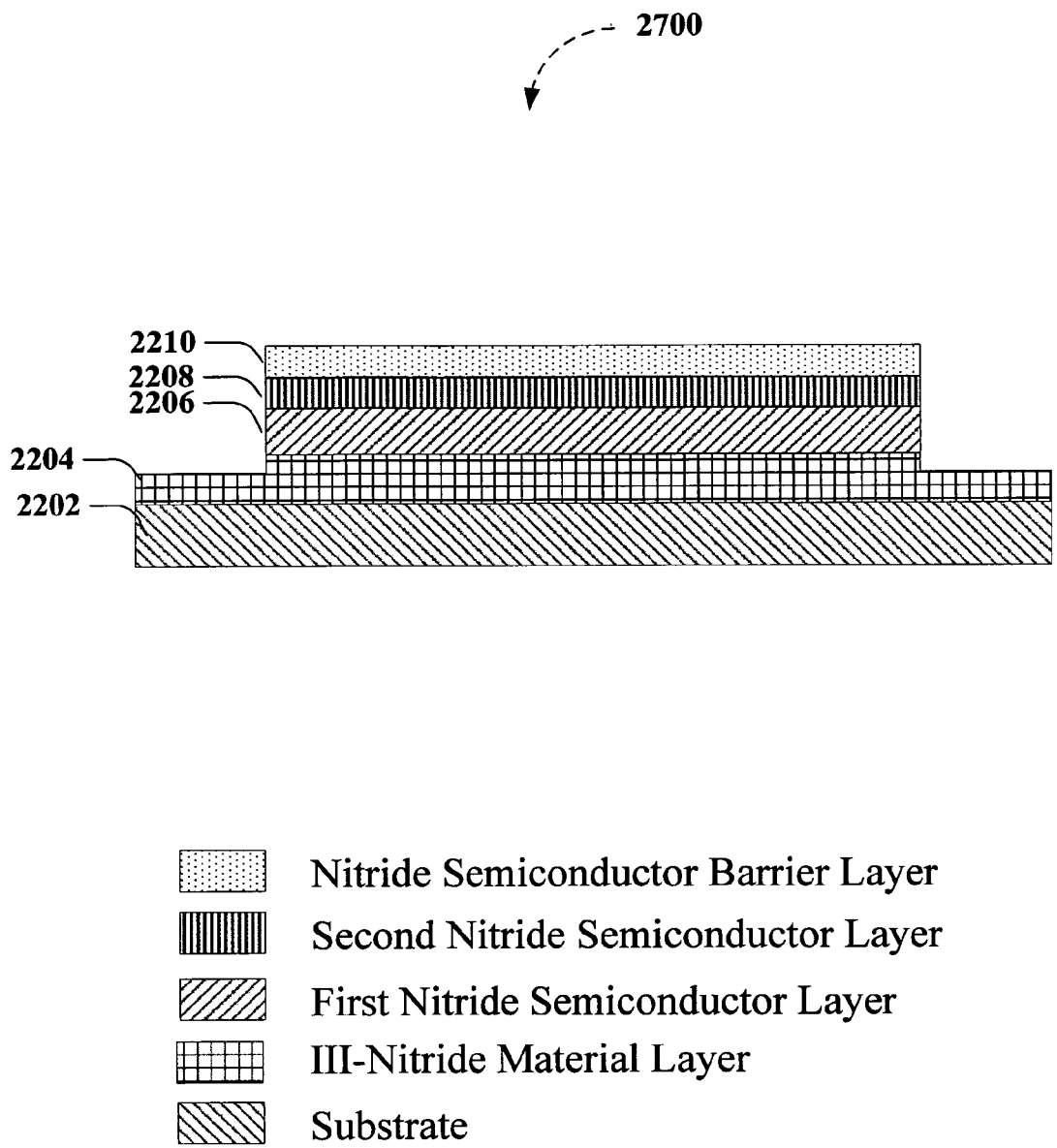
Figure 28:
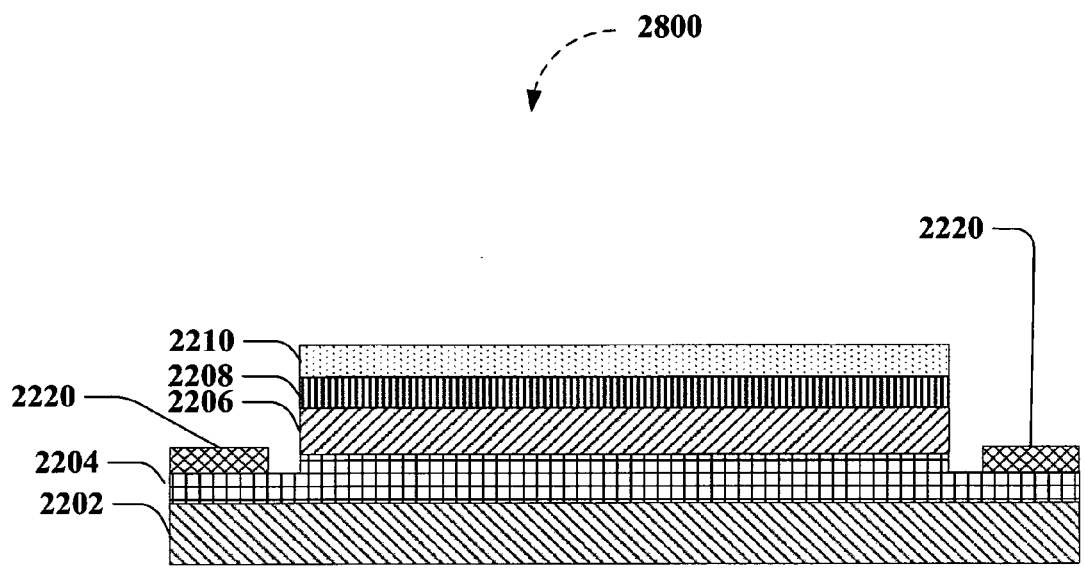

In a further non-limiting implementation as depicted in FIG. 27, one or more active regions can be defined, for example, by dry etching (e.g., dry etching using Chlorine/Helium ($Cl_2$/He) inductively coupled plasma reactive ion etching (ICP-RIE), etc.). According to an aspect, dry etching can remove selected portions of nitride semiconductor barrier layer 2210, second nitride semiconductor layer 2208, first nitride semiconductor layer 2206, and group III-nitride material layer 2204 outside the active region. In a further aspect, in another region outside the active region, the surface of group III-nitride material layer 2204 can be exposed, upon which, the ohmic drain contact 2220 metallization can be formed. For instance, in yet another non-limiting example, in FIG. 28, ohmic drain contacts 2220 can be formed by metal deposition, for example, such as by electron-beam (e-beam) evaporation of any combination of Ti, Al, Ni, Au, etc. (e.g., metal deposition of 20 nm, 150 nm, 50 nm, 80 nm, of Ti, Al, Ni, Au, respectively, and so on) followed by rapid thermal annealing (RTA) (e.g., thermal anneal at 850° C. for 35 seconds, etc.).

Figure 29:
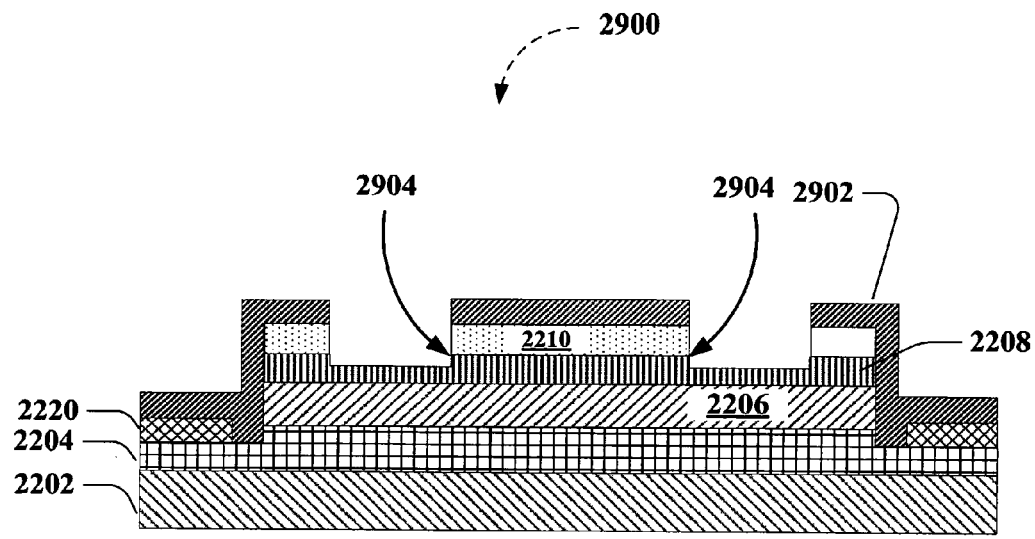

According to a further non-limiting aspect, in FIG. 29, the source regions can be defined for example, with photo resist layer 2902. For instance, in the source regions, nitride semiconductor bather layer 2210, and part of second nitride semiconductor layer 2208 can be removed, for instance, using a $Cl_2$/He plasma dry etch process in an ICP-RIE system. In a further aspect, etching depth can be pre-selected to just reach second nitride semiconductor layer 2208 and to expose the surface of second nitride semiconductor layer 2208 and the 2DEG 2212 (from the side as indicated in FIG. 29 by reference character 2904) in preparation for source contact 2214 metallization. In various embodiments, photo resist layer 2902 can be kept on the developing device 2900 until after source contact 2214 layer deposition and lift-off.

Figure 30:
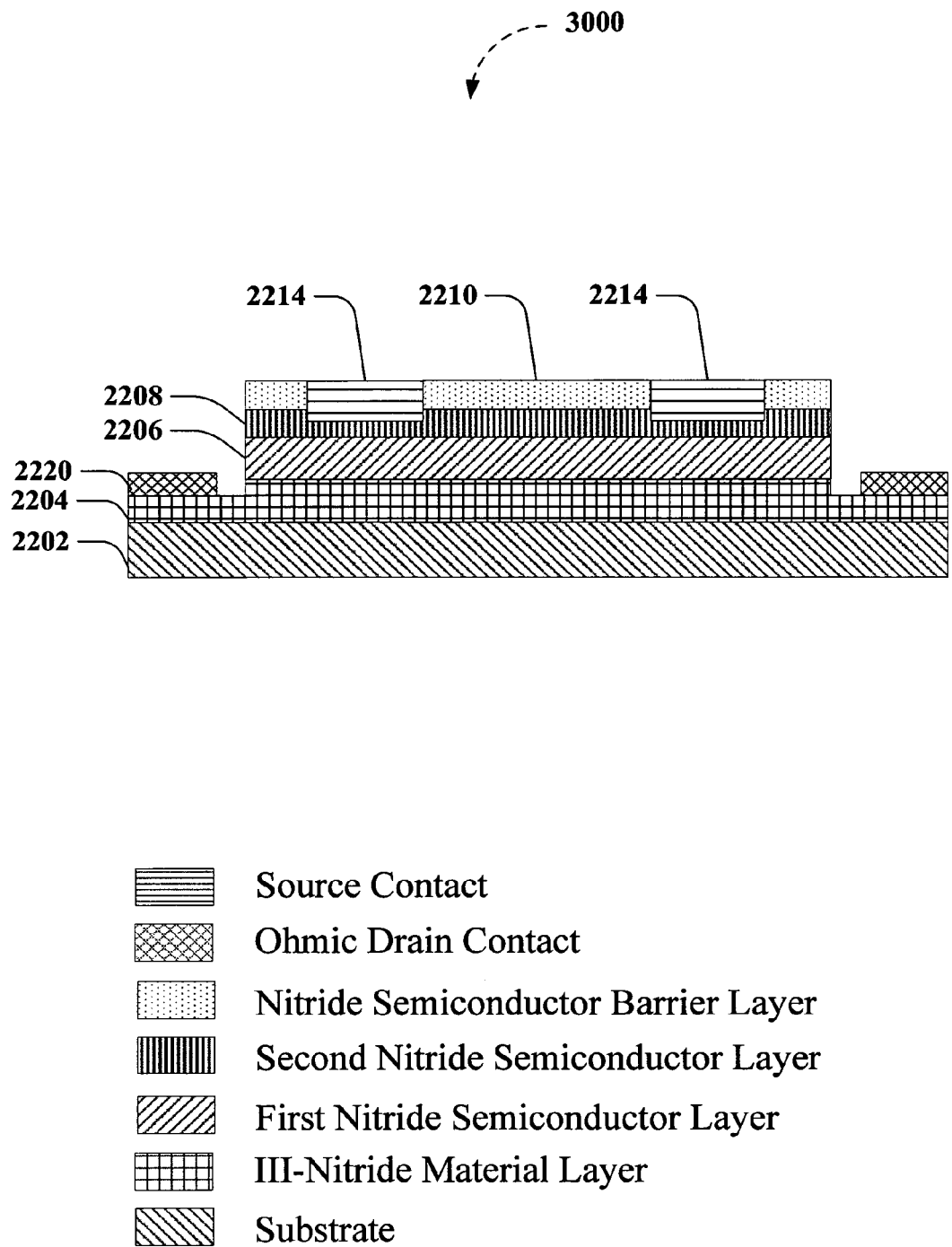

In FIG. 30, according to an aspect, the source contact 2214 electrodes can be formed by metal deposition. For instance, source contact 2214 electrodes can be formed by an electron-beam evaporated metal source (e.g., an Al source, etc.) to deposit a predetermined thickness (e.g., approximately 30 nm) defined by the photo resist layer 2902 shown in FIG. 29, which resist can be subsequently removed during lift-off. In various embodiments, the source contacts 2214 layer can contact the edge of nitride semiconductor bather layer 2210 and second nitride semiconductor layer 2208, and the 2DEG 2212.

Figure 31:
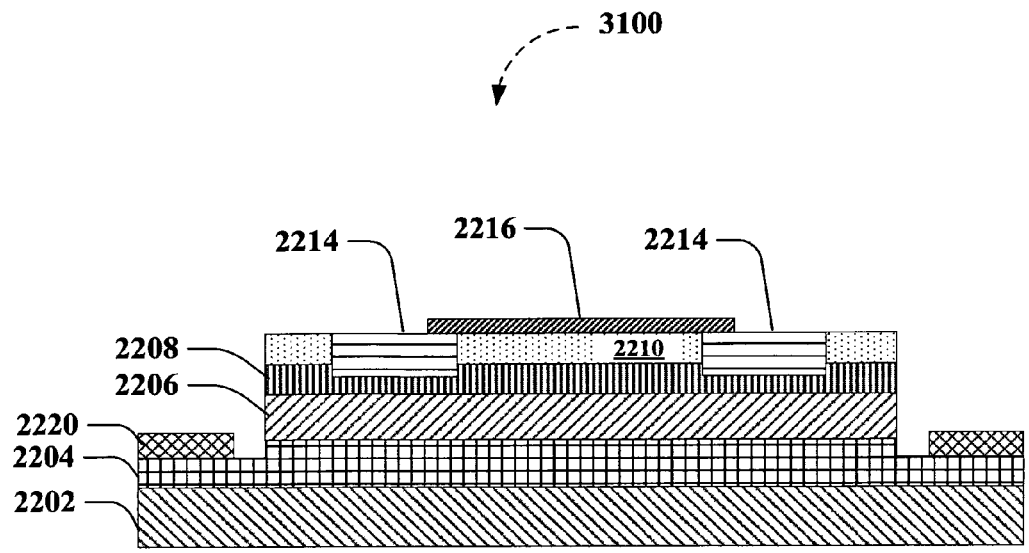
Figure 32:
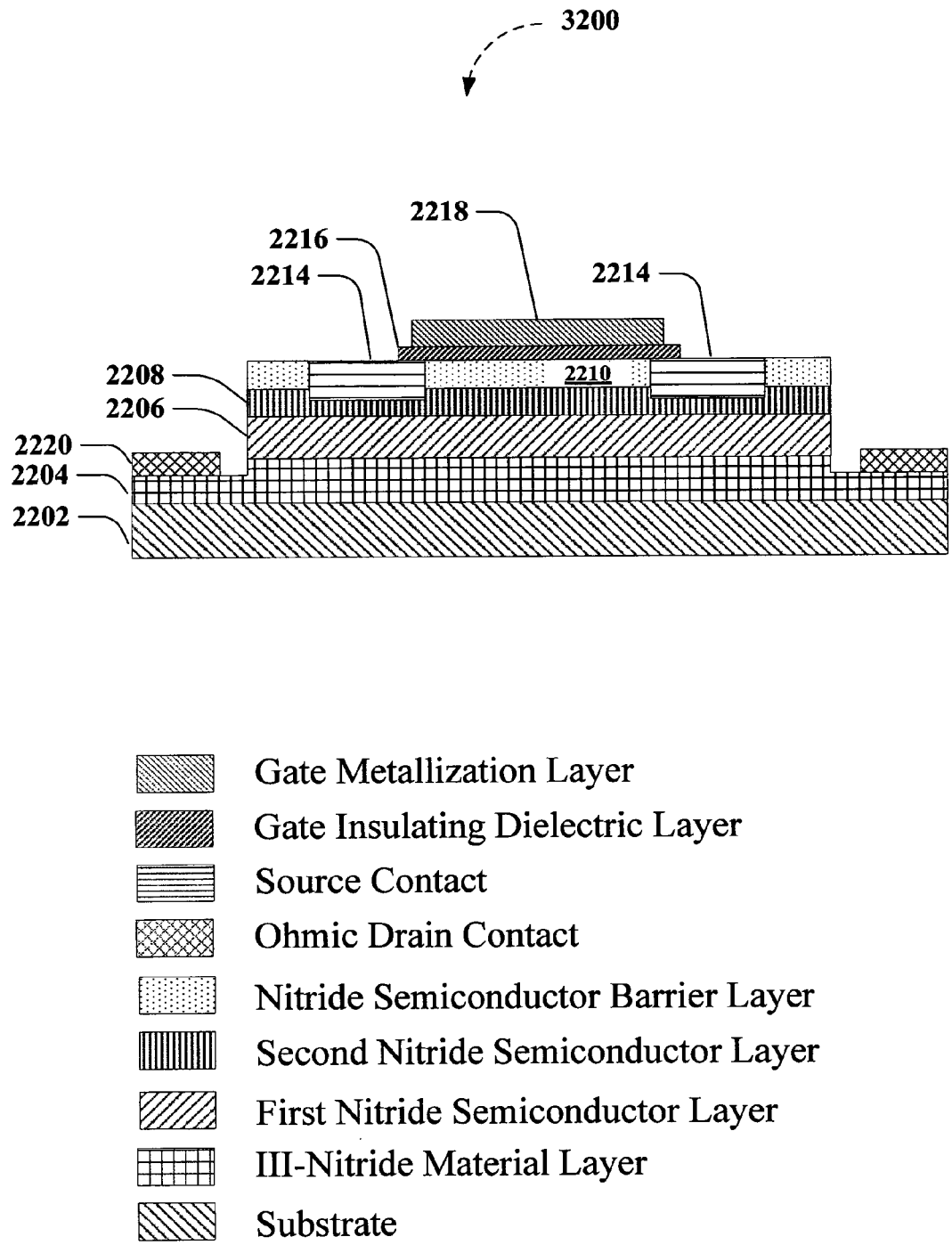
Figure 33:
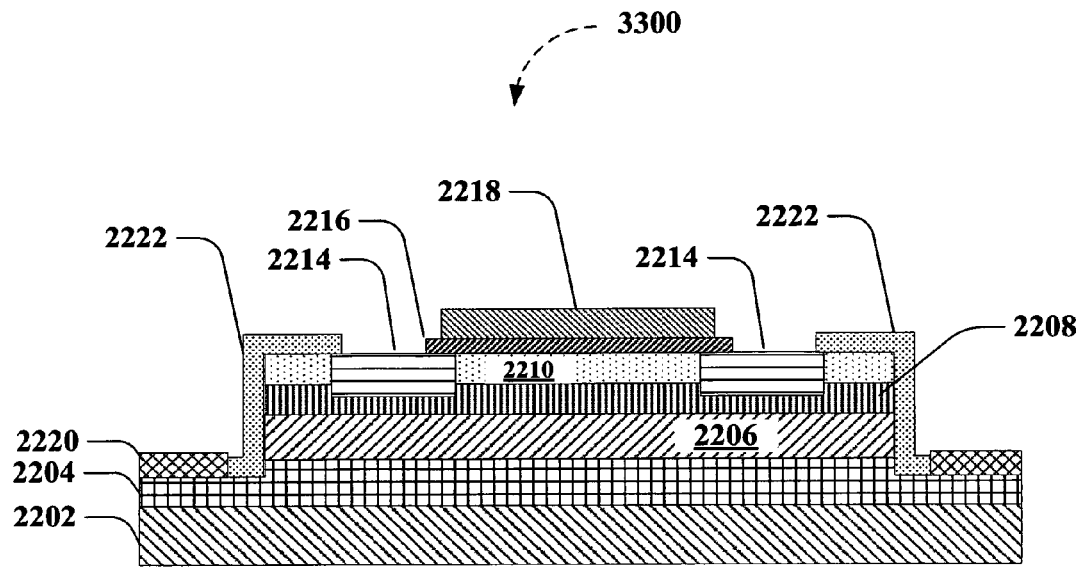

Referring to FIG. 31, in yet other exemplary embodiments, a thin (e.g., approximately 10 nm, etc.) gate insulating dielectric layer 2216 can be grown by, for example, atomic layer deposition (ALD) or other deposition methods (e.g., PE-CVD, sputtering, etc.) over nitride semiconductor barrier layer 2210, source contacts 2214 or portions thereof. From FIG. 31 it can be seen that gate insulating dielectric layer 2216 can cover nitride semiconductor barrier layer 2210, source contacts 2214, or portions thereof. In further embodiments, for example as depicted in FIG. 32, a gate metallization layer 2218 can be used to form gate contact electrodes (e.g., by deposition of electron-beam evaporated Ni and Au), etc. In a further non-limiting aspect as depicted in FIG. 33, a passivation layer 2222 (e.g., a silicon nitride (SiNx) passivation layer) can be deposited to protect the exposed device surface (e.g., such as by PE-CVD).

It can be understood that for VTJ-FET 2300 and VTJ-FET 2400, fabrication stages as described above for VTJ-FET 2200 generally are generally applicable, except for the formation of ohmic drain contact 2302 in VTJ-FET 2300 and ohmic drain contact 2402 in VTJ-FET 2400. Thus, in fabricating VTJ-FET 2300, before the formation of ohmic drain contact 2302, concaved regions can be formed, and in these concaved regions, portions of substrate 2202 and group III-nitride material layer 2204 can be removed as indicated. Accordingly, the back surface of group III-nitride material layer 2204 can be exposed, to enable ohmic drain contact 2302 metallization. As a non-limiting example, the concave regions can be formed via a $Cl_2$/He plasma dry etch in an ICP-RIE system. Likewise, in fabricating VTJ-FET 2400, ohmic drain contact 2402 can be directly formed on the bottom of group III-nitride material substrate layer 2404.

FIG. 34 depicts exemplary non-limiting methodologies 3400 for forming a TJ-FET (e.g., a normally-off III-nitride AlGaN/GaN metal-2DEG TJ-FET 600, 2100 2200, 2300, 2400, 2500, etc.) in accordance with aspects of the disclosed subject matter. For instance, at 3402, methodologies 3400 can comprise, for example, depositing a buffer layer (e.g., III-nitride material buffer layer 104, first and second nitride semiconductor layers 2206/2208 (2406/2408), etc.) over a substrate (e.g., substrate 102, 2202, 2404, etc.) as described above regarding FIGS. 1-6, for example. For instance, depositing a buffer layer over a substrate can include growing the buffer layer over one or more of a sapphire substrate, a silicon (111) substrate, a silicon carbide (SiC) substrate, an aluminum nitride (AlN) substrate, or a Gallium Nitride (GaN) substrate. Furthermore at 3402, depositing a buffer layer can comprise growing the buffer layer over the substrate having a III-nitride nucleation layer, as further described above.

In addition, at 3404, a barrier layer (e.g., III-nitride semiconductor barrier layer 106, nitride semiconductor barrier layer 2210/2410, etc.) can be deposited over the buffer layer (e.g., III-nitride material buffer layer 104, first and second nitride semiconductor layers 2206/2208 (2406/2408), etc.) to form a heterojunction comprising a 2DEG. For instance, as described above, an AlGaN/GaN heterojunction can comprise a high density of carriers in the 2DEG channel.

In further non-limiting aspects of methodologies 3400, a metallic Schottky source contact (e.g., Schottky source contact 110, source contact 2214/2414, etc.) can be formed to the 2DEG. Accordingly, various non-limiting methodologies 3400, the disclosed subject matter can employ a high density 2DEG channel as described herein in Schottky contact with the source metal (e.g., Schottky source contact 110, source contact 2214/2414, etc.), resulting in a thin tunnel barrier (e.g., the depletion region at the metal semiconductor junction) with high tunneling coefficient.

In addition, at 3408 fabrication of the TJ-FET device can be completed. For instance, as described above regarding FIGS. 1-6, 21-33, etc., various fabrication stages can be employed to complete fabrication of the TJ-FET device. For instance, various etch, deposition, passivation, photolithography and other fabrication stages (clean, inspect, defect metrology, etc.) can be performed as described above regarding TJ-FET 600, 2100, 2200, 2300, 2400, 2500, 3300, and so on. For example, regarding VTJ-FET 2500, a portion of the barrier layer 2210 proximate to the design location for the gate 2218 can be trenched as described above regarding FIG. 25.

As a further example, methodologies 3400 can further include growing a gate insulating dielectric layer (e.g., gate insulating dielectric layer 112, gate insulating dielectric layer 2216/2416, etc.) above the barrier layer (e.g., III-nitride semiconductor barrier layer 106, nitride semiconductor barrier layer 2210/2410, etc.) proximate to the design location for the gate (e.g., 602, etc.). In further non-limiting methodologies, a metallic gate (e.g., 602, etc.) can be formed over the gate insulating dielectric layer (e.g., gate insulating dielectric layer 112, gate insulating dielectric layer 2216/2416, etc.) to partially overlay a portion of the metallic Schottky source contact. According to various embodiments, the metallic gate (e.g., 602, etc.) is electrically isolated from the source metal (e.g., Schottky source contact 110, source contact 2214/2414, etc.) by the gate insulating dielectric layer (e.g., gate insulating dielectric layer 112, gate insulating dielectric layer 2216/2416, etc.).

In still other non-limiting methodologies 3400, a drain contact (e.g., ohmic contact layer 108, ohmic drain contact 2220/2302/2402) can be formed in ohmic contact and/or in Schottky contact 2104 with the 2DEG. For instance, regarding FIGS. 22-33 and VTJ-FETs, a drain contact can be formed electrically coupled to the metallic Schottky source contact (e.g., Schottky source contact 110, source contact 2214/2414, etc.) across the heterojunction formed by a barrier layer (e.g., III-nitride semiconductor barrier layer 106, nitride semiconductor barrier layer 2210/2410, etc.) and the buffer layer (e.g., III-nitride material buffer layer 104, first and second nitride semiconductor layers 2206/2208 (2406/2408), etc.).

FIG. 35 depicts further non-limiting methodologies 3500 for TJ-FET fabrication (e.g., for fabricating a normally-off III-nitride AlGaN/GaN metal-2DEG TJ-FET 600, etc.) in accordance with aspects of the disclosed subject matter and with reference to various non-limiting embodiments of FIGS. 1-6 (e.g., a normally-off III-nitride AlGaN/GaN metal-2DEG TJ-FET 600, etc.). For example, at 3502, a device can be isolated on a heterostructure. For instance, as described above, FIG. 2 illustrates 200 an exemplary active region isolation process that can be performed via mesa etching the heterostructure (102/104/106) used for AlGaN/GaN metal-2DEG TJ-FET fabrication.

Non-limiting methodologies 3500 can further include forming, at 3504, an ohmic drain contact on the heterostructure as described above regarding FIG. 3. For example, FIG. 3 further illustrates a schematic cross-section 300 of an exemplary implementation of an AlGaN/GaN metal-2DEG TJ-FET fabrication after formation of an ohmic drain contact 108. In a non-limiting aspect, an ohmic contact layer 108 can be formed on the underlying III-nitride semiconductor barrier layer 106 (and hence underlying 2DEG between III-nitride semiconductor barrier layer 106 and III-nitride material buffer layer 104). In a further non-limiting aspect, the ohmic drain contact 108 can comprise a metal stack (e.g., comprising any of Ti, Al, Ni and Au, etc., or other compositions shown to be effective in forming ohmic contact with low contact resistance). In yet another non-limiting aspect the evolving device can be thermally annealed (e.g., thermally annealed at 850 degrees Celsius for 35 seconds, etc.). According to various embodiments, an ohmic contact layer 108 as described herein can advantageously eliminate the voltage offset that would otherwise occur with the use of a Schottky drain contact.

In a further non-liming aspect, at 3506, non-limiting methodologies 3500 can further include creating a source recess to expose 2DEG as further described above. In addition, at 3508 methodologies 3500 can include forming a Schottky source in contact with the 2DEG. For instance, FIG. 4 further depicts a schematic cross-section 400 of an exemplary AlGaN/GaN Schottky metal-2DEG TJ-FET fabrication including formation of a recessed source and a Schottky source contact 110.

As a non-limiting example, in forming the recessed source and Schottky source contact, dry etching techniques such as ICP-RIE or other etching techniques that create low-damage and nearly vertical sidewall profile can be performed to etch through the III-nitride semiconductor barrier layer 106 and define the source contact region, recess, or groove. As a further example, the source recess or groove can be etched about 25 nm deep and can reach to the GaN layer (e.g., III-nitride material buffer layer 104) so that the source metal is in direct contact to the sidewall of the 2DEG channel (e.g., approximately 6 nm into the III-nitride material buffer layer 104 as measured from the top surface of the III-nitride material buffer layer 104).

Subsequently, a metal layer 110 (e.g., Schottky source contact 110) with single or multiple metal layers (e.g., Ti, Al, Cr, Ni, Pt, Au, etc.) can be deposited on III-nitride material buffer layer 104 to form a Schottky contact to 2DEG. For example, in a particular non-limiting implementation, metal layer 110 (e.g., Schottky source contact 110) can be formed in the recess or groove by depositing single or multiple metal layers comprising one or more of Ti and Au. It should be noted that, according to various embodiments, the tunnel junction exists at the metal-2DEG junction.

According to further non-liming methodologies 3500, a gate insulating dielectric layer can be deposited on the developing TJ-FET at 3510. In a non-limiting example, FIG. 5 further illustrates a schematic cross-section 500 of the AlGaN/GaN metal-2DEG TJ-FET after depositing gate insulating dielectric layer 112. According to various embodiments, gate insulating dielectric layer 112 or passivation layer can comprise a dielectric (e.g., $Al_2O_3$, AlN, SiN, $SiO_2$, $HfO_2$, etc.) that can be grown or deposited on III-nitride semiconductor barrier layer 106. As a further example, in a particular non-limiting embodiment, a gate insulating dielectric layer 112 can comprise an $Al_2O_3$ layer (e.g., a 10 nm $Al_2O_3$ layer grown, for example, by ALD). In addition, in further exemplary implementations, wet etching such as a buffered oxide etch (BOE) or dry etch techniques can be performed to etch through gate insulating dielectric layer 112 to expose source (e.g., Schottky source contact 110 region) and drain contact (e.g., ohmic contact layer 108 region) regions.

In addition, methodologies 3500 can further include depositing a gate on gate insulating dielectric layer at 3512. For instance, FIG. 6 depicts a schematic cross-section of an exemplary AlGaN/GaN metal-2DEG TJ-FET 600 after the formation of a gate electrode 602 and interconnects on the source contact 604 (e.g., Schottky source contact 110 region) and drain contact 606 (e.g., ohmic contact layer 108 region) regions. As can be seen in FIG. 6, a gate metallization layer 114 can be formed by single or multiple metal layers (e.g., including Al, Ti, Ni, Pt, Au, TiN, TiW, etc.).

According to an aspect, gate metallization layer 114 can be deposited on gate insulating dielectric layer 112, and can be further deposited on source (e.g., Schottky source contact 110 region) and drain contact (e.g., ohmic contact layer 108 region) regions to form source and drain interconnects as shown in FIG. 6. As a further example, in a particular non-limiting embodiment, gate electrode 602 and source 604 (e.g., Schottky source contact 110 region) can overlap (e.g., overlap by 0.25 μm). Note further, however, that gate electrode 602 and source 604 are electrically separated by the gate insulating dielectric layer 112. In yet other exemplary implementations, AlGaN/GaN metal-2DEG TJ-FET can include passivation layer 116 which shall be formed with insulating dielectric materials such as SiN, $SiO_2$, $Al_2O_3$, polyimide, etc.

While the disclosed subject matter has been described in connection with the preferred embodiments of the various figures, it is to be understood that other similar embodiments may be used or modifications and additions may be made to the described embodiments for performing the same function of the disclosed subject matter without deviating therefrom. For example, one skilled in the art will recognize that aspects of the disclosed subject matter as described in the various embodiments of the present application may apply to other Group III-Nitride heterostructures, other insulating or semiconducting materials or substrates, etc.

For instance, in various embodiments, the disclosed subject matter applies to III-nitride metal-2DEG tunnel junction field-effect transistors (TJ-FETs). As described herein, exemplary non-limiting TJ-FETs can comprise a substrate layer (e.g., Si, sapphire, SiC, GaN, AlN, etc.), a III-nitride nucleation layer above the substrate, a III-nitride undoped buffer layer above the nucleation layer, a III-nitride undoped channel layer above the buffer layer, and so on. Note that, the channel layer could be the same as the III-nitride buffer layer (e.g., GaN) or it could be different from the buffer layer (e.g., when the buffer is selected as AlGaN, the channel layer can be selected as GaN). In addition, exemplary non-limiting TJ-FETs can include a III-nitride barrier layer including a cap layer, a two-dimensional electron gas (2DEG) conducting channel located at the heterointerface between the buffer layer and the barrier layer, and a metallic source electrode making Schottky contact to the 2DEG channel.

In addition, in further implementations, exemplary non-limiting TJ-FETs can comprise a metallic drain electrode making ohmic contact to the 2DEG channel, and an insulating dielectric layer above the said bather layer, which dielectric layer also covers the source electrode, at least in part. Moreover, exemplary implementations can include a metallic gate electrode on top of the gate dielectric layer partially overlapping but electrically separated from (by the said gate dielectric layer) the source electrode, in addition to a final passivation layer made of dielectric materials.

As described above, various modifications are contemplated. For instance, exemplary TJ-FETs can comprise a source region recessed into the channel layer and exposing the 2DEG channel along the sidewalls of the recessed region, for instance to enable the source Schottky contact to be in contact with the 2DEG along the exposed sidewall. In addition, disclosed TJ-FETs are capable of normally-off or enhancement-mode operation with positive threshold voltage by appropriate 2DEG density in as-grown epitaxial wafer. Disclosed TJ-FETs can also comprise a 2DEG channel having high density that is in Schottky contact with the source metal in order to achieve thin tunnel bather with high tunneling coefficient. As described above, Disclosed TJ-FETs are capable of delivering high ON/OFF current ratio and low off-state leakage due in part to the Schottky source providing a naturally reverse biased Schottky junction that suppresses the buffer leakage.

In addition, disclosed TJ-FETs can also comprise an ohmic drain that can facilitate a device free of drain bias offset and that can deliver low on-resistance. Moreover, in an aspect the drain contact to the 2DEG channel can be made in the form of Schottky contact rather than an Ohmic contact to provide reverse drain blocking capability. Advantageously, the disclosed subject matter can, in various embodiments, deliver small sub-threshold slope as the turn-on of the conducting channel is determined by the tunneling process instead of being limited by the diffusion process. Various implementations can also be immune to drain induced barrier lowering effect, as described above, making it especially attractive for short-channel devices.

Note that, according to various embodiments, disclosed TJ-FETs can have higher off-state breakdown voltage than conventional HEMT as the depletion starts from the source tunnel junction instead the gate edge on the drain side. Additionally, various embodiments can include source electrodes that are highly scalable and can be readily reduced in size. Thus, as a further advantage, various embodiments can be monolithically integrated with conventional depletion-mode HEMT and/or MIS-HEMT (metal-insulator-semiconductor HEMT) fabricated on the same wafer, which can be used to realize directly coupled FET logic circuits, III-nitride smart power integrated circuits that feature complete integration of power devices and digital/analog functional blocks, etc.

As described above, for certain embodiments, current flow can be said to flow in a lateral path from the source to the drain, resulting in a lateral device. Where current flow can be said to flow in a vertical path from the source to the drain, and across the heterojunction, the devices are described as vertical devices.

For instance, an exemplary non-limiting device implemented in a vertical structure can comprise one or more of a substrate layer (e.g., Si, sapphire, SiC, GaN, AlN, etc.), a III-nitride nucleation layer above the substrate, a heavily-doped (e.g., with Si as the dopant) n-type III-nitride semiconductor contact layer above the nucleation layer, a lightly-doped III-nitride semiconductor spacer layer above the heavily-doped n-type contact layer, an undoped III-nitride semiconductor channel layer above the lightly-doped III-nitride spacer layer, a III-nitride barrier layer including a cap layer and a two-dimensional electron gas (2DEG) conducting channel located at heterointerface between the channel layer and the barrier layer. In addition, exemplary implementations can include a metallic source electrode making Schottky contact to the 2DEG channel, a metallic drain electrode making ohmic contact to the heavily doped contact layer, and an insulating dielectric layer above the barrier layer, where the dielectric layer also covers the source electrode.

In various implementations, a metallic gate electrode can be deposited on top of the gate dielectric layer and partially overlapping but electrically separated from (by the said gate dielectric layer) the source electrode. In addition, according to further exemplary implementations, the gate electrode can be located in a trench that is etched to the channel layer, or the said spacer layer. As described above for lateral devices, vertical devices can also be monolithically integrated with conventional HEMT and MIS-HEMT on the same wafer.

As a further example, in addition to the disclosed layers, it is conceivable that other layers for purposes other than described in one or more embodiments herein can be introduced between such layers. However, in such cases, such intermediate layers, without effect, can be considered as part of the disclosed layers. Moreover, sometimes layers inadvertently introduced (e.g., process contaminants, oxidation, natural impurities, etc.) are also formed as a byproduct of an industrial fabrication process and such layers also are not to be considered separate layers.

In other instances, variations of process parameters (e.g., dimensions, configuration, concentrations, concentration profiles, implant energies and doses, process step timing and order, addition and/or deletion of process steps, addition of preprocessing and/or post-processing steps, etc.) may be made to further optimize the provided structures, devices and methodologies, as shown and described herein. In any event, the structures and devices, as well as the associated methodologies described herein have many applications in tunnel-junction field-effect transistors. Therefore, the disclosed subject matter should not be limited to any single embodiment described herein, but rather should be construed in breadth and scope in accordance with the appended claims.

What is claimed is:

1. A tunnel junction field-effect transistor (TJ-FET) having a source, a gate, and a drain, the TJ-FET comprising:
   a substrate comprising a buffer layer deposited on the substrate and a barrier layer deposited on the buffer layer, the buffer layer and the barrier layer forming a heterojunction of the TJ-FET at an interface of the buffer layer and the barrier layer; and
   a metal region at the source, adjacent to the buffer layer, and spanning across the interface, wherein the metal region forms a gate-controlled Schottky tunnel junction with the heterojunction.

2. The TJ-FET of claim 1, the substrate comprising at least one of sapphire, silicon (111), silicon carbide (SiC), aluminum nitride (AlN), or GaN.

3. The TJ-FET of claim 1, the buffer layer is deposited on the substrate over a nucleation layer comprised of a group III-nitride.

4. The TJ-FET of claim 1, the substrate comprises sapphire, the buffer layer comprises undoped GaN, and the barrier layer comprises a III-nitride barrier layer.

5. The TJ-FET of claim 1, further comprising:
   an insulating dielectric layer deposited above the barrier layer proximate to the gate.

6. The TJ-FET of claim 5, further comprising:
   the gate deposited above the insulating dielectric layer.

7. The TJ-FET of claim 6, the gate further adapted to partially overlay a portion of the metal region that is electrically isolated from the metal region by the insulating dielectric layer.

8. The TJ-FET of claim 7, the gate further adapted to at least partially fill a trench etched in a portion of the barrier layer.

9. The TJ-FET of claim 1, the heterojunction comprising a two-dimensional electron gas (2DEG) conducting channel proximate to the gate, wherein the gate-controlled Schottky tunnel junction of the TJ-FET is adapted to produce a tunneling current in response to a voltage applied to the gate.

10. The TJ-FET of claim 9, further comprising:
    the drain spanning a portion of the heterojunction and in at least one of ohmic contact or Schottky contact with the 2DEG.

11. A normally-off metal two-dimensional electron gas (metal-2DEG) tunnel junction field-effect transistor (TJ-FET), comprising:
    a second nitride semiconductor layer deposited on a first nitride semiconductor layer;
    a nitride semiconductor barrier layer deposited on the second nitride semiconductor layer and forming a heterojunction comprising a two-dimensional electron gas (2DEG) at an interface of the nitride semiconductor barrier layer and the second nitride semiconductor layer; and
    at least one metallic source contact associated with the metal-2DEG TJ-FET and in Schottky contact with the 2DEG across the heterojunction, wherein the at least one metallic source contact is adapted to produce a tunneling current between the at least one metallic source contact and the 2DEG in response to a voltage applied to a gate of the metal-2DEG TJ-FET.

12. The metal-2DEG TJ-FET of claim 11, further comprising at least one of an ohmic or a Schottky drain contact electrically coupled to the at least one metallic source contact across the heterojunction.

13. A method of forming a tunnel junction field-effect transistor (TJ-FET) having at least one design location for a source, a gate, and a drain of the TJ-FET, the method comprising:
    depositing a buffer layer over a substrate;
    depositing a barrier layer over the buffer layer to form a heterojunction of the TJ-FET comprising a two-dimensional electron gas (2DEG); and
    forming a tunnel junction to the 2DEG comprising forming a metallic Schottky source contact in direct physical contact to the 2DEG across the heterojunction.

14. The method of claim 13, the depositing the buffer layer includes growing the buffer layer over at least one of a sapphire substrate, a silicon (111) substrate, a silicon carbide (SiC) substrate, an aluminum nitride (AlN) substrate, or a Gallium Nitride (GaN) substrate.

15. The method of claim 13, the depositing the buffer layer includes growing the buffer layer over the substrate having a III-nitride nucleation layer.

16. The method of claim 13, further comprising:
trenching a portion of the barrier layer proximate to the design location for the gate.

17. The method of claim 13, further comprising:
growing a gate insulating dielectric layer above the barrier layer proximate to the design location for the gate.

18. The method of claim 17, further comprising:
forming a metallic gate over the gate insulating dielectric layer to partially overlay a portion of the metallic Schottky source contact.

19. The method of claim 13, further comprising:
forming a drain contact in at least one of ohmic contact or Schottky contact with the 2DEG.

20. The method of claim 19, the forming a drain contact includes electrically coupling the drain contact to the metallic Schottky source contact across the heterojunction.

* * * * *